US00RE37146E

(19) United States
(12) Reissued Patent
Cole et al.

(10) Patent Number: US RE37,146 E
(45) Date of Reissued Patent: Apr. 24, 2001

(54) LOW POWER INFRARED SCENE PROJECTOR ARRAY AND METHOD OF MANUFACTURE

(75) Inventors: Barrett E. Cole, Bloomington; Chien J. Han, Plymouth, both of MN (US)

(73) Assignee: Honeywell International Inc., Morristown, NJ (US)

(21) Appl. No.: 09/239,304

(22) Filed: Jan. 29, 1999

Related U.S. Patent Documents

Reissue of:
(64) Patent No.: 5,600,148
Issued: Feb. 4, 1997
Appl. No.: 08/367,492
Filed: Dec. 30, 1994

(51) Int. Cl.[7] ..... G01J 1/00
(52) U.S. Cl. ..... 250/495.1; 250/504 R
(58) Field of Search ..... 250/495.1, 504 R, 250/453.1

(56) References Cited

U.S. PATENT DOCUMENTS

| | | |
|---|---|---|
| 2,983,283 | 5/1961 | Oberly . |
| 4,510,558 | 4/1985 | van den Brink . |
| 4,530,010 | 7/1985 | Billingsley . |
| 4,639,603 | 1/1987 | Pistor . |
| 4,654,622 | 3/1987 | Foss et al. . |
| 4,724,356 | 2/1988 | Daehler . |
| 4,859,080 | 8/1989 | Titus et al. . |
| 4,922,116 | 5/1990 | Grinberg et al. . |
| 5,021,663 | 6/1991 | Hornbeck . |
| 5,077,563 | 12/1991 | Takeuchi et al. . |
| 5,159,480 | 10/1992 | Gordon et al. . |
| 5,214,292 | 5/1993 | Hendrick, Jr. . |
| 5,245,369 | 9/1993 | Um et al. . |
| 5,300,788 | 4/1994 | Fan et al. . |
| 5,610,637 | 3/1997 | Sekiya et al. . |
| 5,657,060 | 8/1997 | Sekiya et al. . |

FOREIGN PATENT DOCUMENTS

| | | |
|---|---|---|
| 2274943 | 8/1994 | (GB) . |
| 9326050 | 12/1993 | (WO) . |

OTHER PUBLICATIONS

D.R.Stauffer et al, article "Thermal Scene Pprojectors Using Microemitters", Bellingham US Nov. 1991 vol. 30, No. 11, pp. 1664–1667.

G.H.Chapman et al, article "A Wafer Scale Dynamic Thermal Scene Generator", International Conference on Wafer Scale Integration, Jan. 22–24, 1992, San Francisco, CA.

M. Parameswaran et al, article "Commercial CMOS Fabricated Integrated Dynamic Thermal Scene Simulator", International Electron Devices Meeting, Dec. 8–11, 1991, Washington, pp. 753–756.

(List continued on next page.)

*Primary Examiner*—Bruce C. Anderson
(74) *Attorney, Agent, or Firm*—John G. Shudy, Jr.

(57) ABSTRACT

An array for projecting thermal images and a method of making same. The array of the present invention combines a two-tier architecture created with special processing whereby each pixel member resides on an elevated platform directly over discrete pixel control electronics and electrically conducting traces couple a plurality of pixels so that they can be controlled to project thermal images at equal to or faster than video frame rates. Microlens assemblies coupled to each discrete pixel improves the thermal efficiency of the array for certain applications. In the method of fabrication, a semiconductor microbridge-type structure obtains with the use of sacrificial layers under deposited pixel members in a compact array so that the pixel electronics reside beneath their associated pixel and the array electronics inhabit the same chip as the array thereby improving fill factor and time constant of the resulting array.

24 Claims, 19 Drawing Sheets

(Amended)

OTHER PUBLICATIONS

R.G.Driggers et al., article "Review of Infrared Scene Projector Technology—1993", from Optical engineering, vol. 33, No. 7, Jul. 1994, Bellingham, pp. 2408–2416.

M.Parameswaran et al., article "Micromachined Thermal Radiation Emitter From a Commercial CMOS Process" from IEEE Electron Device Letters, Feb. 12, 1991, vol. 12, No. 2, pp. 57–59.

B.E.Cole et al, article "512×512 Infrared Cryogenic Scene Projector Arrays", Honeywell Technology Center, Feb. 7, 1995, pp. 193–202.

B.W. Ludington, "Ultra–Low–Power Scene Projector for Targets Against Space Backgrounds," in Characterization, Propagation and Simulation of sources and Backgrounds III, Proc. SPIE 1967, 39–50 (1993).

Article entitled "Electrically Heated Pixel (EHP) Arrays for Dynamic Infrared Scene Generation" by A.P.Pritchard and S.P.Lake; British Aerospace plc, Sowerby Research Centre (FPC 267); filton, Bristol, BS12 7QW UK; pp. 182–188 from the SPIE vol. 940 Infrared Scene Simulation: Systems, Requirements, Calibration, Devices and Modeling (1988).

Article entitled: A High Fill Factor Suspended Resistor IR Scene Generator: Design, Fabrication and Preliminary Performance by A.P.Pritchard, M.C.Hebbron, S.P.Lake and I.M.Sturland; British Aerospace plc Sowerby Reseaarch Centre, FPC 267 Filton Bristol BS12 7QW UK; pp. 15–26 from SPIE vol. 1967.

Article entitled: "Infrared Scene Displays and Their Use in Detector and Processor Assessment" by A.D.Hart, A.P.Pritchard and S.P.Lake; Sowerby Research Centre, Naval Weapons Division, British Aerospace P.L.C., PO Box 5, Filton, Bristol, Great Britain; pp. 153–158 from Infrared Phys. vol. 27, No. 3, 1987.

Article entitled "Dynamic Infrared Scene Projector for Missile Seeker Simulation" by W.S.Chan, J.S.Shie, C.H.Wang, V.K.Raman, Y.C.Chou, T.karunasiri and R.Frenzel; pp. 250–255 from Computer Simulation and SPIE, orlando, FL (1991).

Article entitled "512×512 Infrared Scene Projector Array for Low Background Simulations" by B.E.Cole, C.J.Han, R.E.Higashi, J.Ridley, J.Holmen, J.Anderson, D.Nielsen, H.Marsh, K.Newstrom and C.Zins, Honeywell Technology Center; 10701 Lyndale Ave S. Bloomington, MN 55420—1994 (Hilton Head Conference).

Article entitled: Recent Progress in Large Dynamic Resistor Arrays by B.Cole, R.Higashi, J.Ridley, J.Holmen and E.Benser; Honeywell Technology Center, 12001 State Highway 55, Plymouth, MN 55441; R.Stockbridge and L.Murrer; Wright Laboratory/MNGI, 101 West Eglin Blvd., STE 309, Elgin AFB, FL 32542; L.Jones; Science Applications International Corp., 1237–B North Elgin Parkway, Shalimar, FL 32579 and E.burroughs; RTTC, STERT–TE–E–SA Bldg. 4500, Redstone Arsenal, AL 35898; pp. 1–13 from SPIE 1997.

Article entitled: Dynamic IR Scene Generation: Basic Requirements and Comparative Display Device Design: by A.P. Pritchard; Sowerby Research Centre, British Aerospace plc, FPC 267, Filton, Bristol BS12 7QW, UK; pp. 144–149 from SPIE vol. 940 Infrared Scene Simulation: Systems, Requirements, Calibration, Devices and Modeling (1988).

Article entitled "Honeywell Infrared Projector Technology" 1993, Honeywell Inc.

Article entitled: "High–performance 512×512 scene projector for targets against space backgrounds", B.Cole, C.J.Han and R.Higashi, et al., SPIE 94.

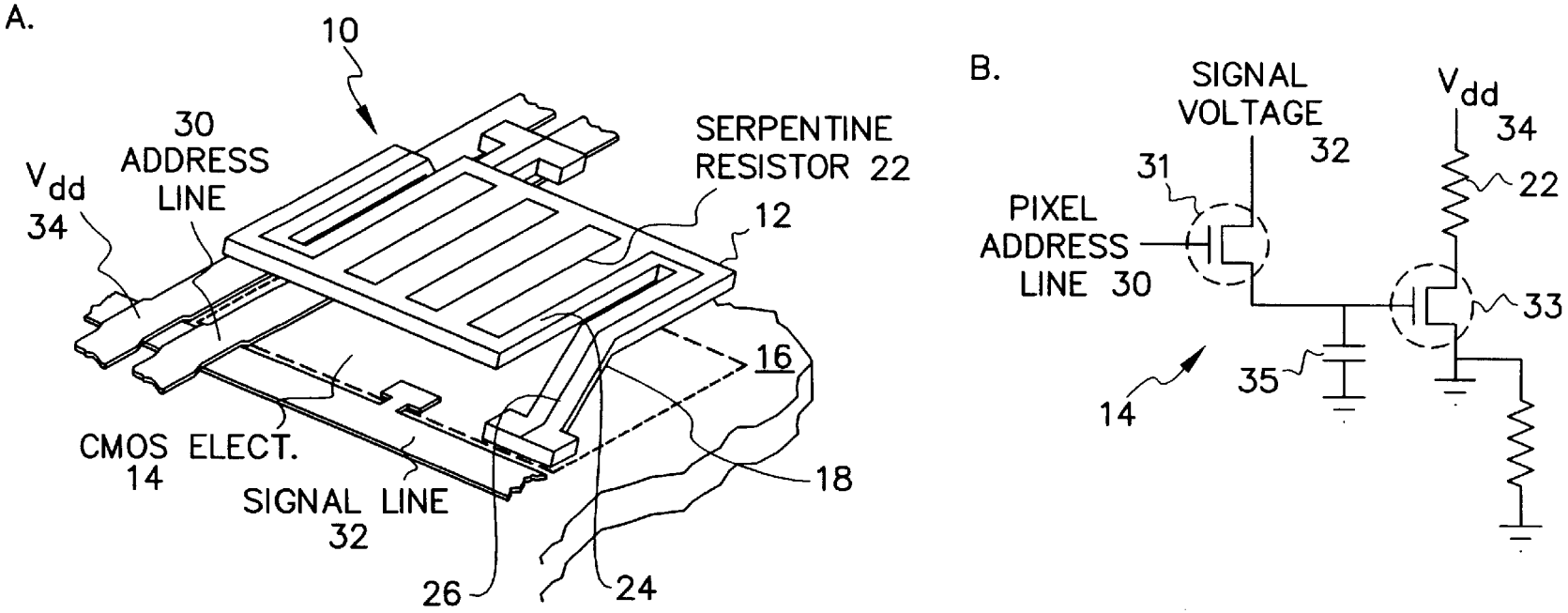
Fig. 1 (Amended)

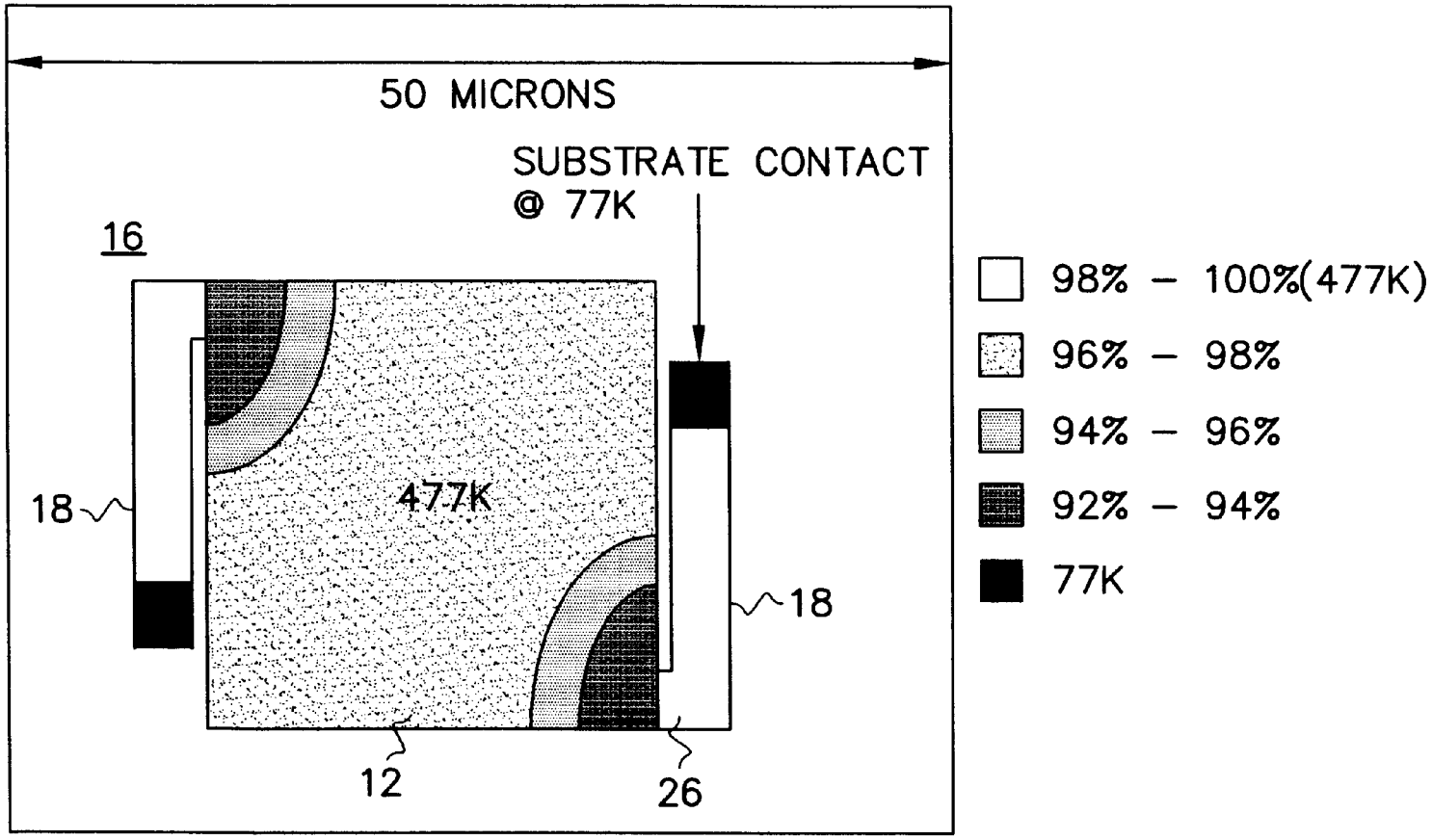
Fig. 2 (Amended)

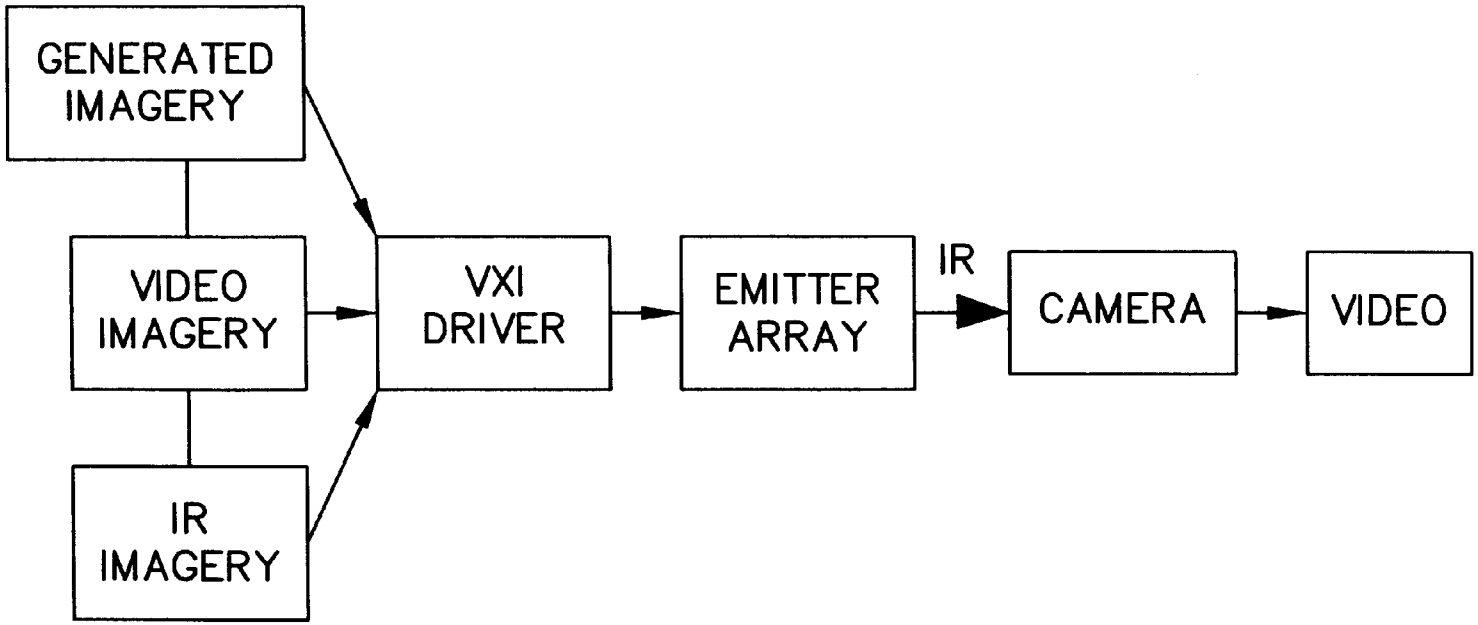
Fig. 3(Amended)

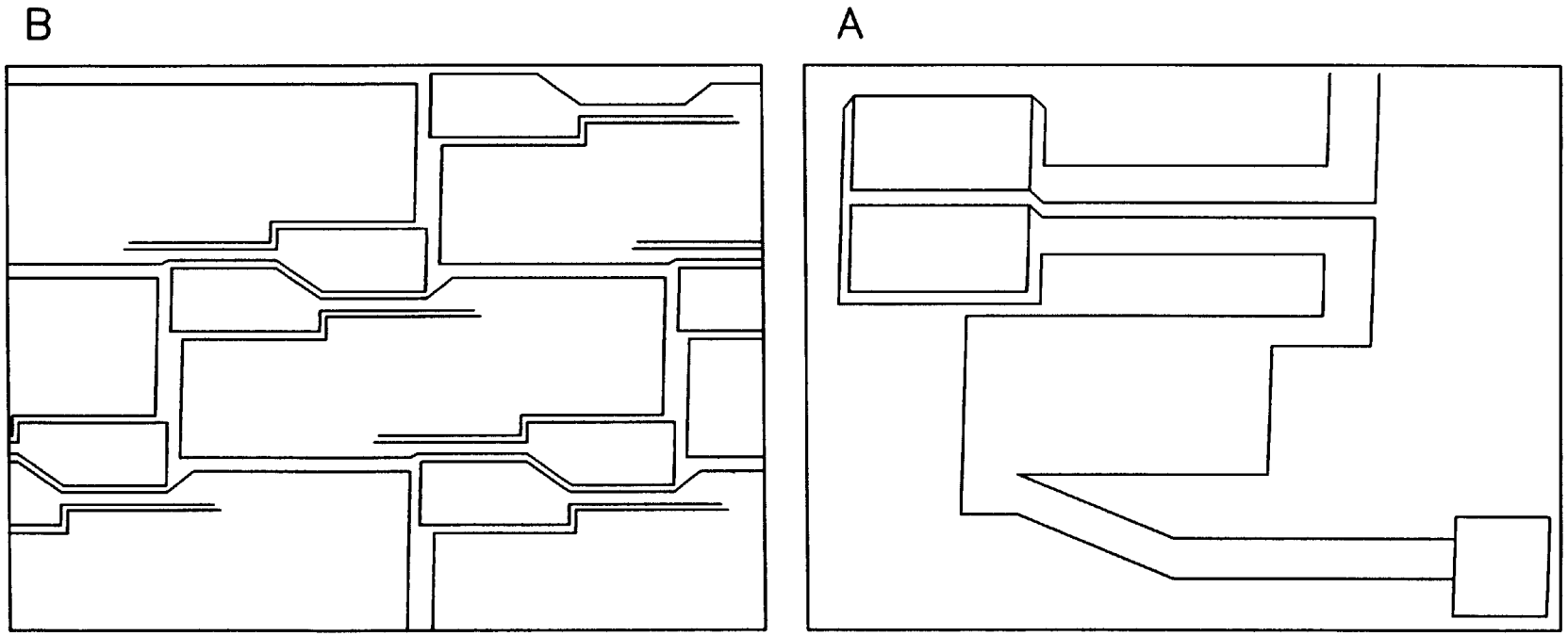
Fig. 7 (Amended)

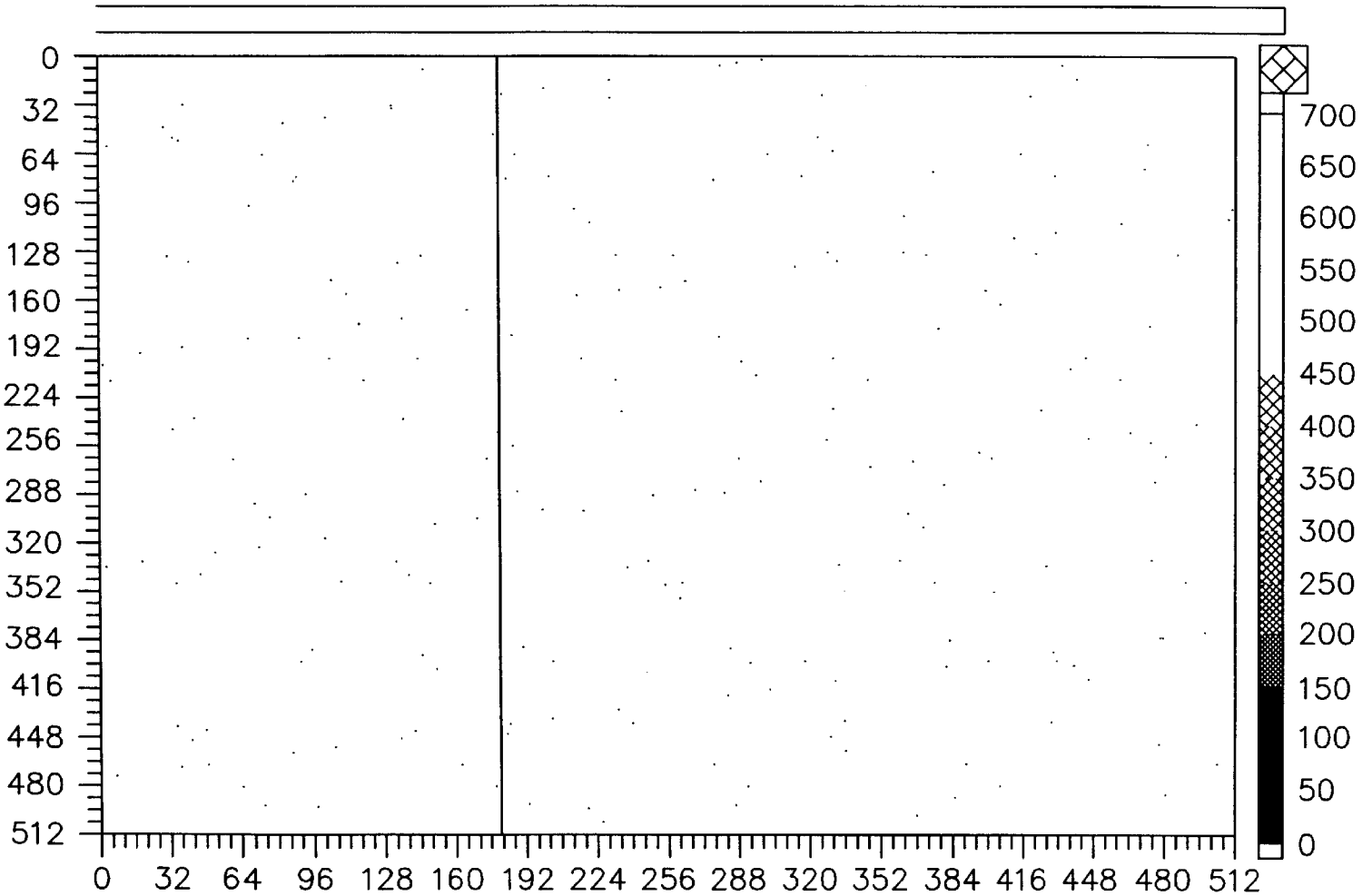
Fig. 8 (Amended)

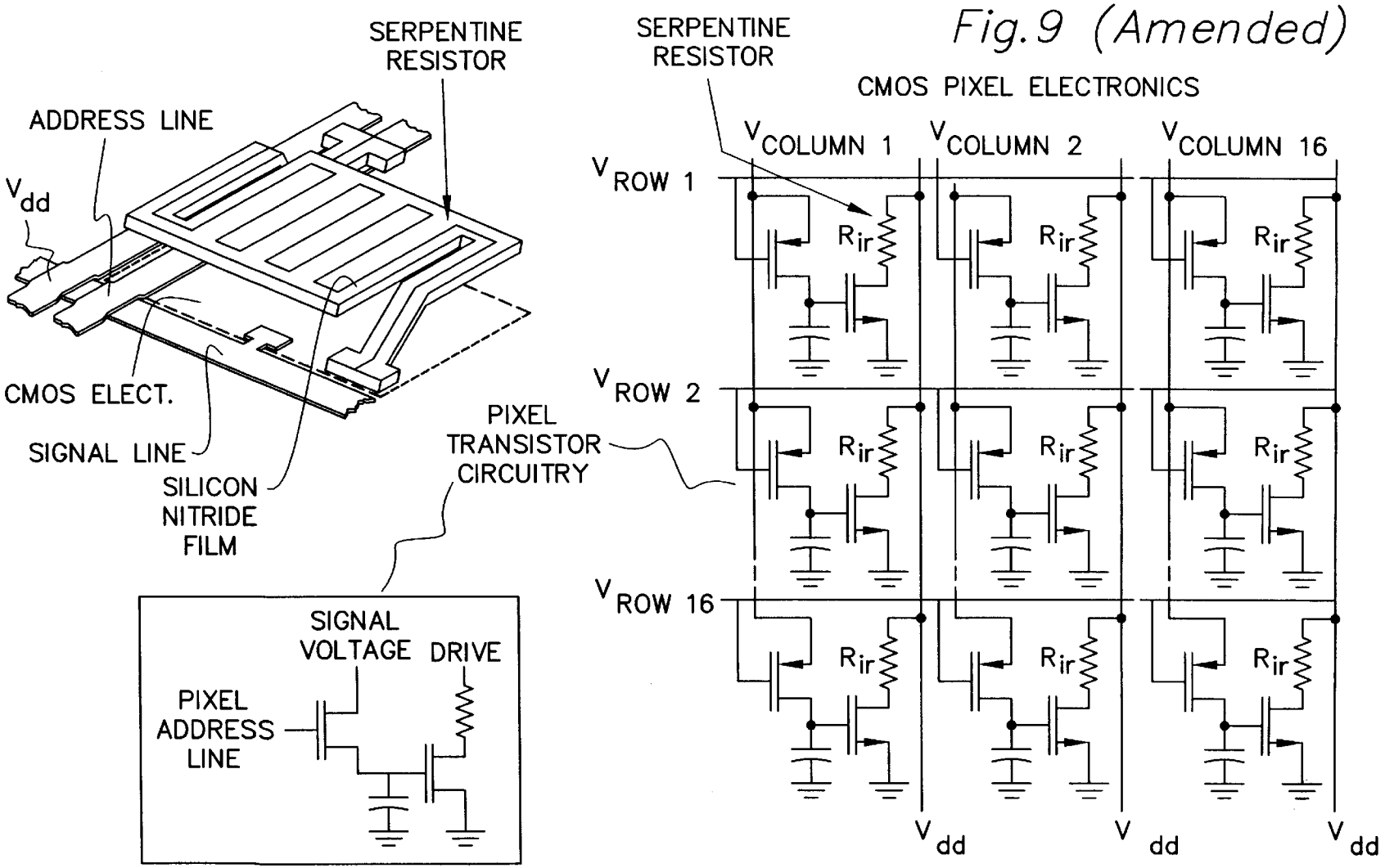
Fig. 9 (Amended)
CMOS PIXEL ELECTRONICS
SERPENTINE RESISTOR
$V_{COLUMN\ 1}$
$V_{COLUMN\ 2}$
$V_{COLUMN\ 16}$
$R_{ir}$
$V_{ROW\ 1}$
$V_{ROW\ 2}$
$V_{ROW\ 16}$
$V_{dd}$
PIXEL TRANSISTOR CIRCUITRY
SERPENTINE RESISTOR
ADDRESS LINE
$V_{dd}$
CMOS ELECT.
SIGNAL LINE
SILICON NITRIDE FILM
SIGNAL VOLTAGE
DRIVE
PIXEL ADDRESS LINE

COLUMN DECODERS

4-BIT BCD COLUMN DECODE
Vee 3
50
1 1
2 1
3 1
7 1
8 1
ROW GROUP 1
9 1
10 1
11
ROW GROUP 2
15 1
16 1
121 1
122 1
123 1
127 1
128 1
ROW GROUP 16
127 1
128 1
16
COLUMN GROUP 16

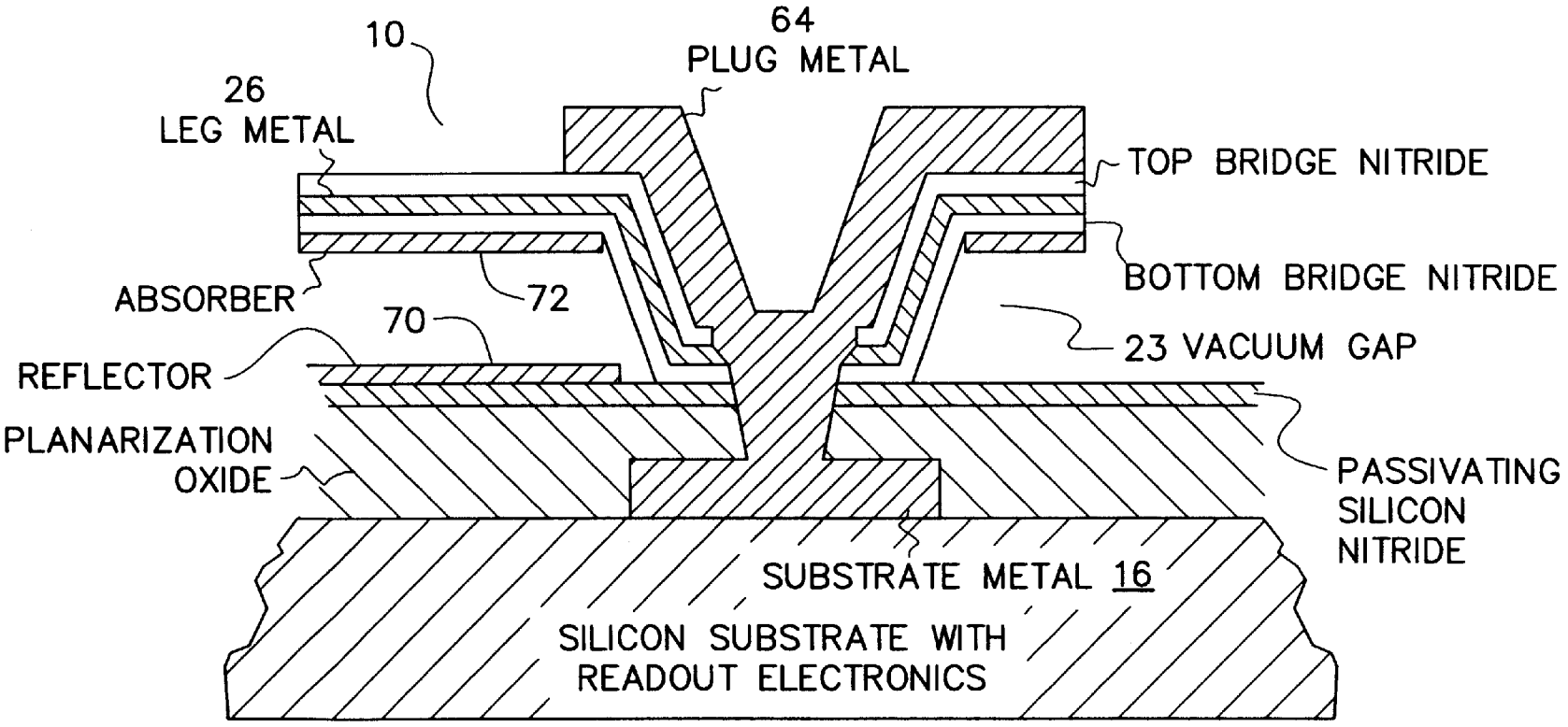
Fig. 11 (Amended)

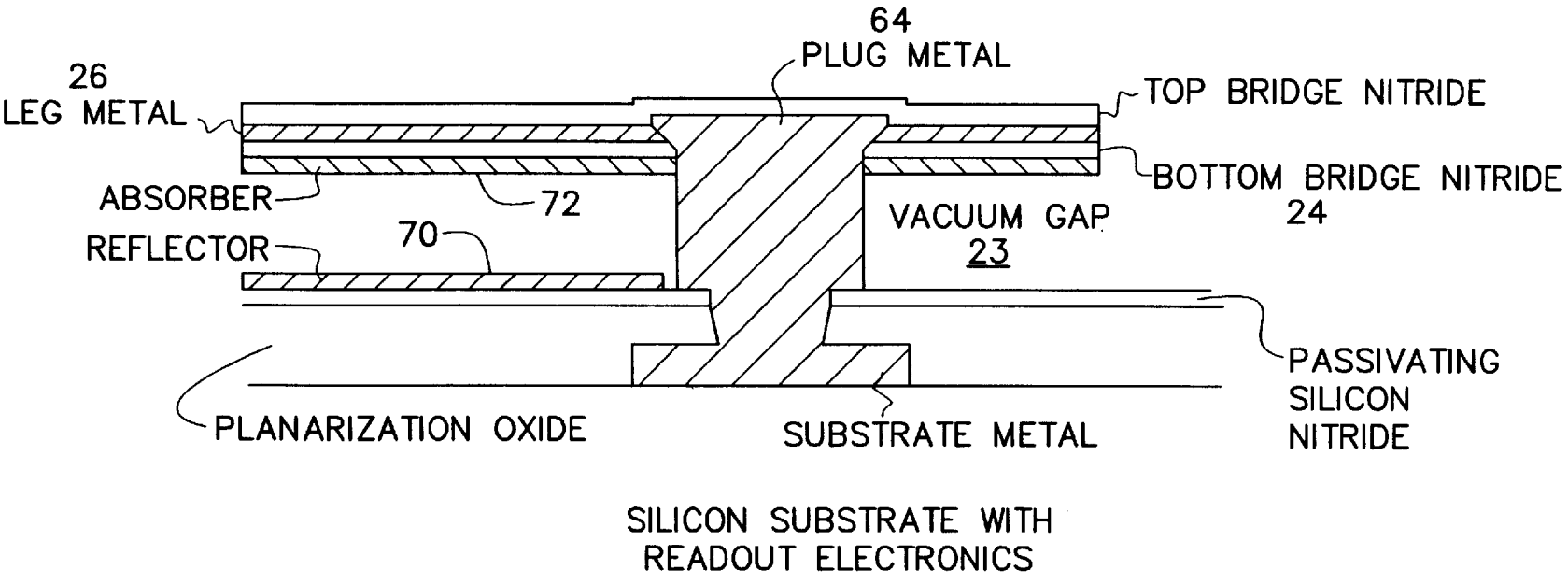
Fig. 12 (Amended)

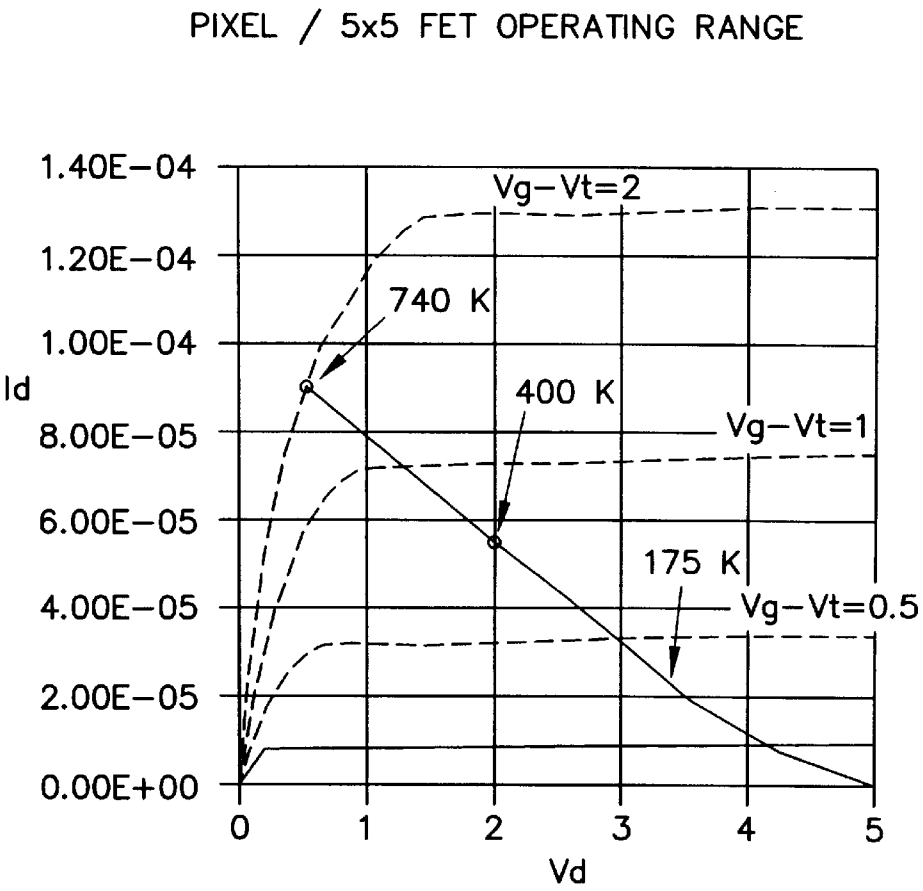
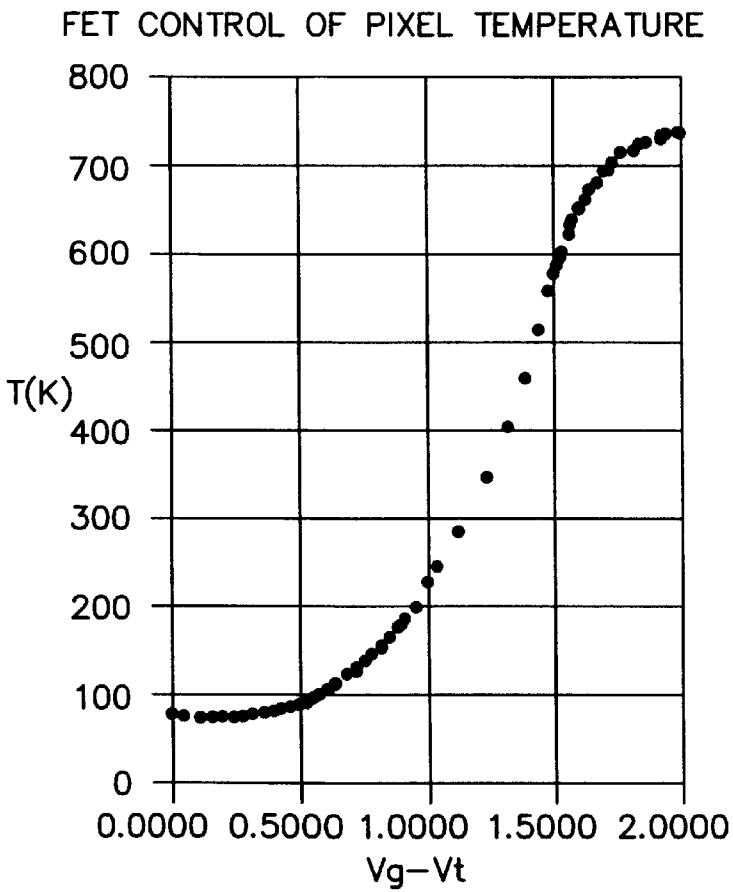
Fig. 15 (Amended)

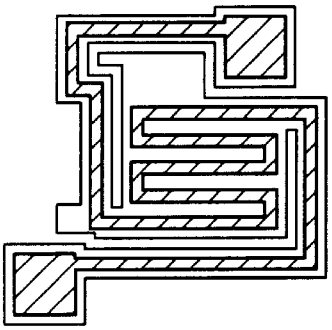
2-MIL PIXEL
Fig. 16A
(Amended)
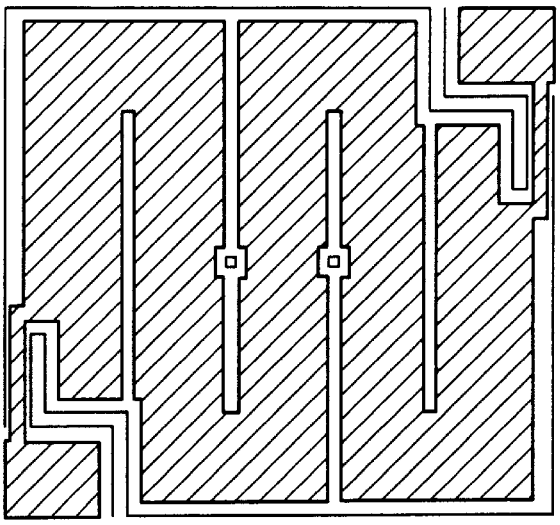
3.5-MIL PIXEL
Fig. 16B
(Amended)
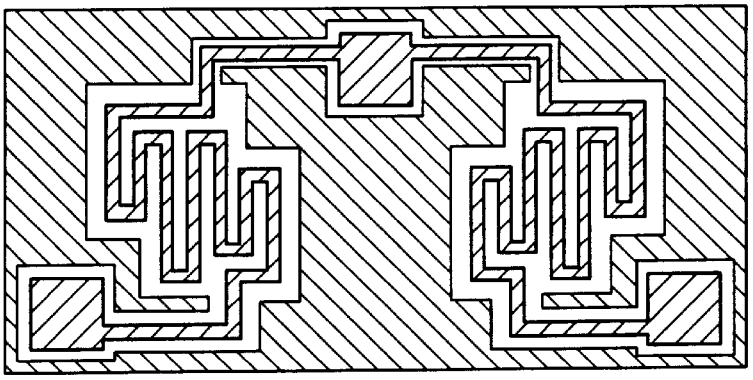
2.0-MIL PIXEL: 2 msec.
THERMAL TIME CONSTANT
Fig. 16C
(Amended)

LOW POWER INFRARED SCENE PROJECTOR ARRAY AND METHOD OF MANUFACTURE

Matter enclosed in heavy brackets [ ] appears in the original patent but forms no part of this reissue specification; matter printed in italics indicates the additions made by reissue.

FIELD OF THE INVENTION

This invention relates to image projection and particularly, infrared (IR) image projection from an array of tightly packed resistively heated microstructure emitters that requires relatively small amounts of electrical power to drive the emitters. The microstructure array operates at cryogenic temperatures in order to simulate low-radiance space backgrounds and at room temperatures for earth-bound backgrounds.

BACKGROUND OF THE INVENTION

A major challenge in IR projector array technology is to produce a high-emittance structure that requires relatively little electrical power during operation. Resistor arrays are one popular approach to obtaining IR scene projectors capable of wide dynamic range.

Typically, an array designed for projecting radiation in the IR spectrum will have a large number of discrete pixel structures coupled to drive electronics. Arrays can be fabricated with a wide range of pixel sizes and pitches to meet the requirements of a specific optical systems. A representative array of the prior art may have 96 pixels and operates in the short-wavelength IR (SWIR) to the long-wavelength IR (LWIR) wavebands. The arrays may be optimized to a desired wavelength of projection purpose, such as generating dynamic radiation clutter scenes or multiple independently moving targets against a background that simulates conditions in the upper atmosphere of Earth. Variations in the thermal and electrical properties of the array are achievable via modification of the pixel, considering collimator optics and field of view (FOV) requirements of the desired application.

A critical parameter of thermal radiating projection elements is known as the thermal time constant "T", defined by "T"=C/G, where G is the thermal conductance between the heated element and a substrate associated with the element, and C is the thermal mass of the heated element. To achieve high-speed performance necessary to display dynamic IR scenes a pixel must have a short thermal time constant. Thus, a successful design will exhibit a thermal time constant that is a fraction of the frame rate at which the projector operates. Given as thermal time constant of millisecond duration, the pixels must be heated to many hundreds of degrees above ambient temperature to display high radiance scenes using only milliwatts of power per pixel. However, thermal isolation between adjacent pixels and the substrate associated with the pixel must be maintained to limit cross talk among adjacent pixels in the array.

The array electronics are relied upon to control pixel temperatures and maintain temperatures between frame updates for reduced image flicker. Traditionally located beside the IR arrays, recent advanced in CMOS addressing electronics and fabrication techniques have lead to a two-level IR array structure with the electronics disposed beneath a pixel emitter associated therewith, so that high fill factors may be achieved with pixels covering virtually the entire surface of the IR array.

SUMMARY OF THE INVENTION

The high performance, low power IR scene projector array of the present invention benefits from high radiance efficiency due to the low power requirements, high fill factors, and high emittance of the resistively heated microstructure emitters. Furthermore, the present invention exhibits response over a large dynamic range due to the low substrate temperature and the high temperature materials used in the fabrication of the instant invention.

The array operates in a two-level architecture wherein the array resides suspended on support legs, which provide a very low thermal leakage path, and the array electronics are disposed underneath the array in a compact and efficient manner so that high fill factors result.

A vacuum environment and use of low thermal conductance materials serve to isolate the entire assembly from thermal transients. High optical emissivity results from the tuned optical cavity design and deliberate selection of emitter and special films chosen to optimize optical properties of the array.

Low temperature operation properties of the instant invention result from careful selection of the resistor, pixel films, and the electronics.

The emitter resistor has a large operating temperature range via: low negative thermal coefficient of resistance (TCR) in the 20–650 degree Kelvin temperature range is ideally suited to a drive mode of projection driven by electrical current, the pixel resistance of about 40 kOhms provides optimal heating at low electrical current levels, and the emitter material has a resistance of about 1 kOhm per square, thereby permitting use of a 40 square serpentine pattern which fits into the small pixel geometry. The emitter thermal design accounts for low temperatures: silicon nitride films, implementations of a cold heat sink that reduces effective hot conductance by 50%, and pixel design pre-adjusted for temperature-dependent time constants.

The pixel has millisecond response time and no "flicker" because: thermal conductance defines radiance decay, heating power controls radiance increase, flexible design covers a wide range of time constants, and the non-refreshed current droop measures less than one percent after five minutes. The pixel field effect transistor (FET) benefits from excellent low temperature characteristics through the use of radiation hardened (radhard) RICMOS electronics, FET conductance improved by a factor of two at 20 degrees Kelvin, and carrier freeze out does not affect performance. The pixel time constant is adjustable by changing the length of the support legs that couple the array to the substrate.

To achieve very high speed performance, collimating microlens assemblies couple to each emitter pixel allows the emitter to be smaller and thus have a shorter time constant for the same thermal conductance while simulating a 100% fill factor. The microlens also allows the [size] use of reduced-size emitters and thus the thermal response time of the pixel is decreased thereby leading to increased frame rates.

Two level architecture, bearing hybridized pixel drive electronic beneath the supported emitters capable of operating at near-room temperature significantly improves on the prior art and represents the latest iteration of this advance IR scene projection technology.

BRIEF DESCRIPTION OF THE DRAWINGS

FIG. 1 depicts a perspective view of a two-level emitter pixel of the present invention at A, and a schematic representation of the electrical circuit associated with a single emitter pixel.

FIG. 2 is a graphical representation of calculated emitter pixel temperature gradient for one embodiment of emitter pixel according to the present invention.

FIG. 3. is a flow diagram depicting the functional elements of a scene projector array coupled to imagery generation devices, drivers, and camera and display units.

FIG. 7 depicts two scanning electron microscope micrographs of 15% fill factor and 50% fill factor 2-mil pixels.

FIG. 8 is an array map of the electrical current in a given array mode according to the present invention, which principally measures "dead" pixels in the array.

FIG. 9 depicts a perspective view of a discrete pixel made according to the present invention, an electrical schematic of the discrete pixel electronics, and an electrical schematic of the CMOS pixel pixel electronics for a portion of an array made according to the present invention.

FIG. 11 is an elevational side view in cross section of a "basket" contact usable with the present invention, for supporting, electrically coupling, and thermally isolating an emitter pixel from the substrate.

FIG. 12 is an elevational side view in cross section of a "plug metal" contact usable with the present invention, for supporting, electrically coupling, and thermally isolating an emitter pixel from the substrate.

FIG. 15 are two graphs depicting typical FET control of pixel temperature and the electrical current versus voltage of a typical pixel made according to the present invention.

FIG. 16 a)–c) are plan views of configuration of pixel resistors usable with the present invention.

DESCRIPTION OF THE PREFERRED EMBODIMENT

Figure 4:
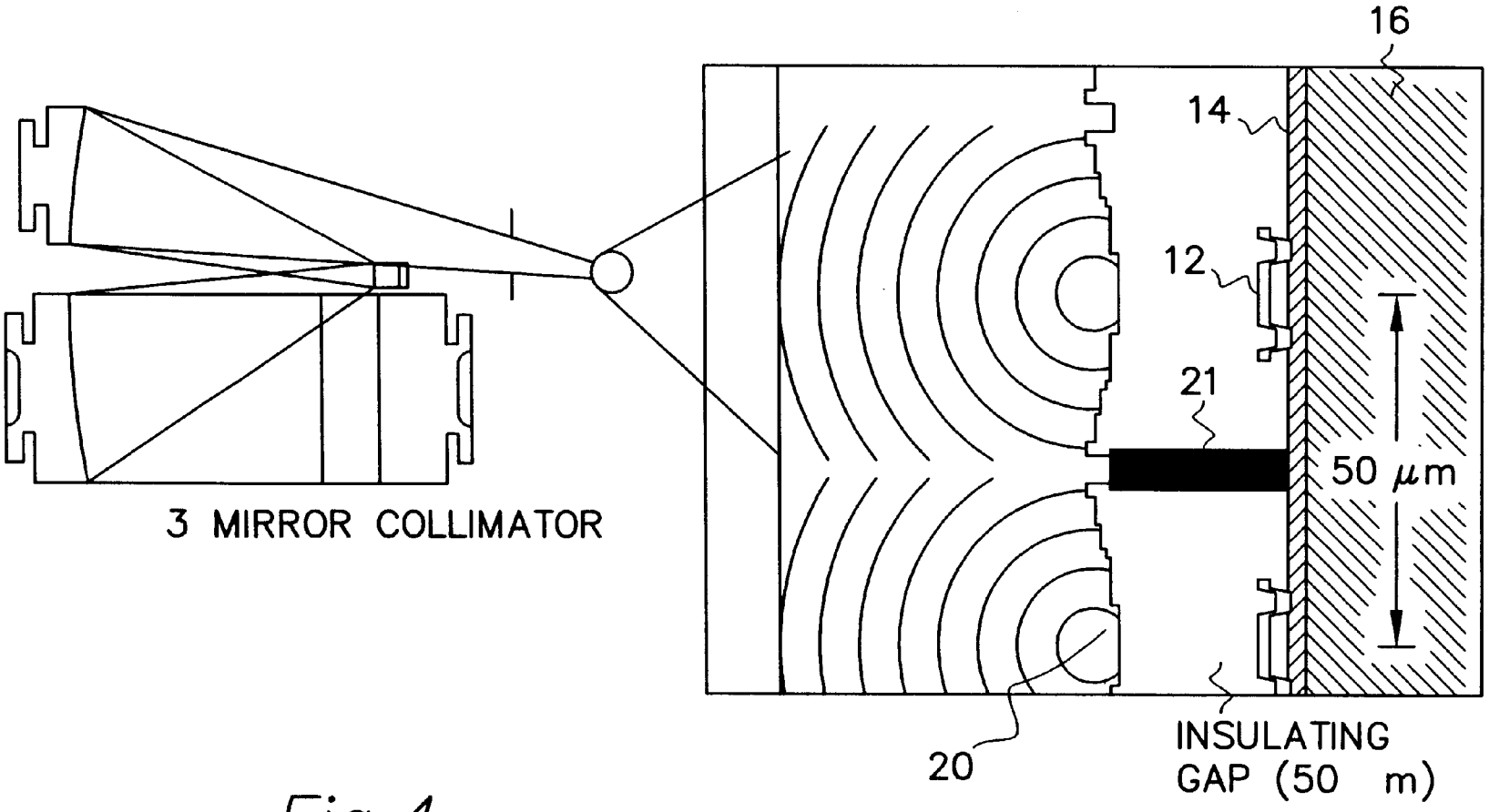
FIG. 4 is an elevational view of an optics system for suitable projecting imagery driven through an emitter pixel array coupled to a microlens assembly, and having the emitter pixel array shown in partial exploded cross section.

Referring to FIG. 1A, depicting a single emitter pixel 12 associated with a two level IR array 10 architecture of the present invention, in addition to the use of collimating microlens assemblies 20 mounted on stand-off posts 21 for focusing radiation emitted from each emitter pixel 12, as further shown in FIG. 4. The array 10 typically comprises a plurality of emitter pixels 12 each supported above and electrically coupled to associated emitter pixel drive electronics 14 residing on a substrate 16 by at least one leg 18. One embodiment of the pixel 12 provides a serpentine resistive element 22 patterned on a silicon nitride thin film 24, so that the resistive element 22 electrically couples to the drive electronics 14 with an electrically conducting trace 26 following the leg 18 to the substrate 16 and a suitable electrical coupling (shown in FIG. 1 B) on the substrate connected appropriately to allow for rapid addressing of the pixel in cooperation with other emitter pixels 12 of the array 10, thereby projecting radiation indicative of an image. The legs 18 may be formed of silicon nitride or other material exhibiting a high degree of thermal isolation.

Figure 5A:
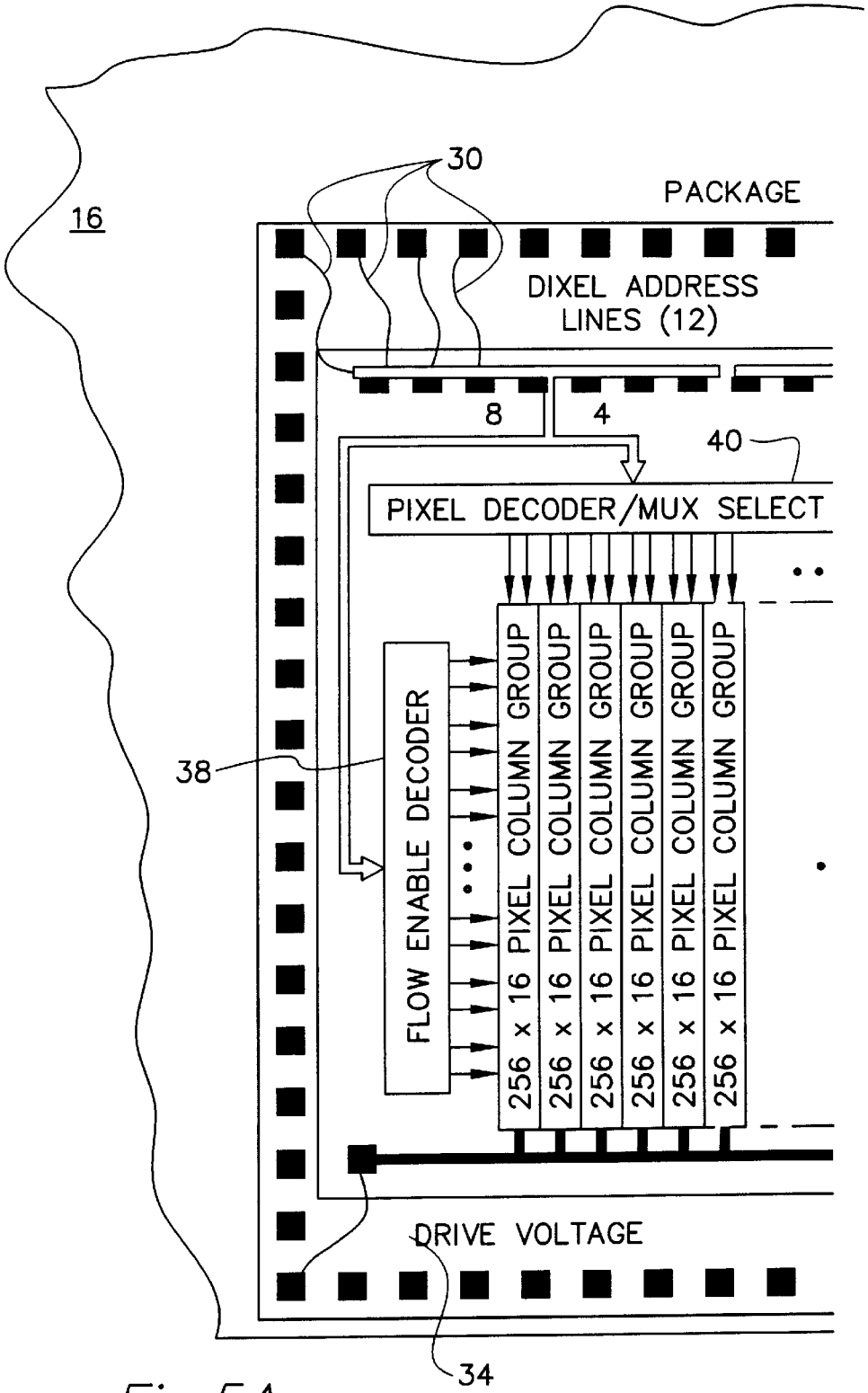
FIG. 5A–B is a plan view of the addressing electronics associated with an emitter pixel array of the present invention.
Figure 5B:
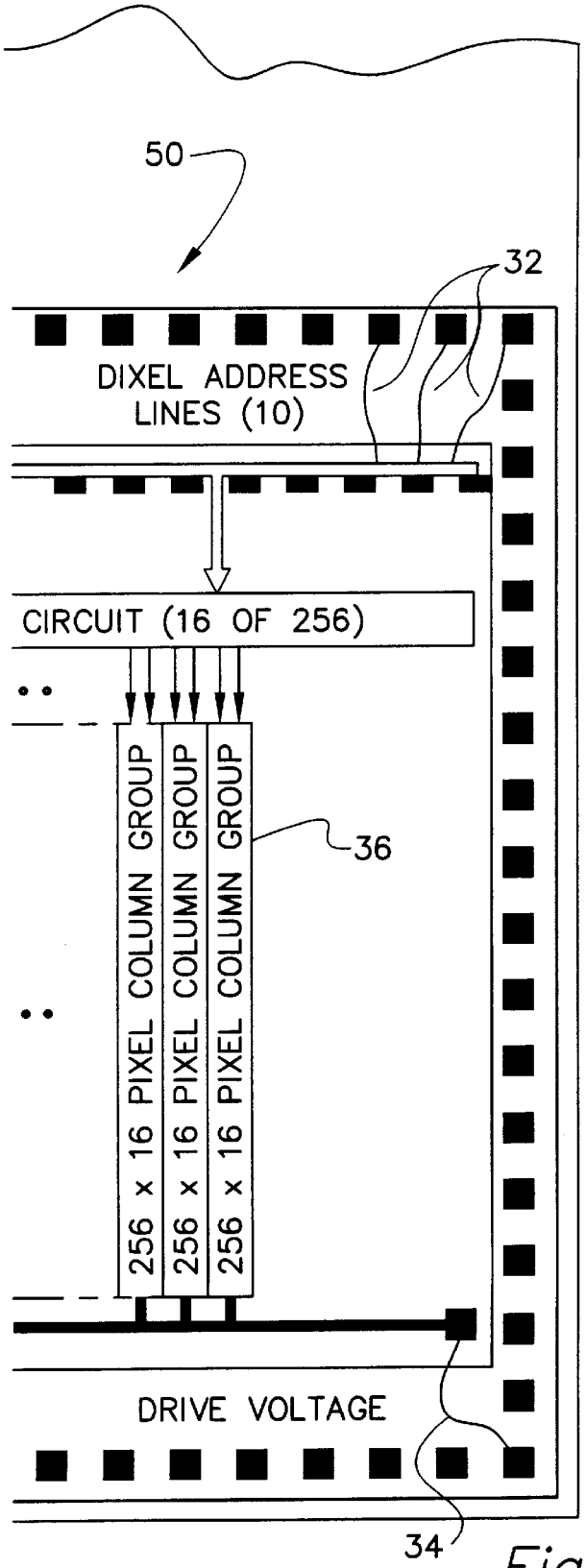

The drive electronics 14 couple to the emitter where the trace 26 electrically couples the emitter pixel 12, as mentioned, to drive the suspended emitter pixel 12. The drive electronics 14 control and maintain the temperature of each emitter pixel 12 during operation of the array 10, and include CMOS addressing electronics 50 described below, that are preferably constructed of radiation hardened CMOS semiconductor circuit components to allow use of the array 10 in nuclear radiation testing environments. As shown in FIG. 5, the periphery of array 10 carries address electronics 50 consisting of a plurality of column group electronics 36 and at least one row decoder 38 and a pixel decoder multiplex selector circuit 40, to appropriately activate discrete emitter pixels 12 to create an image of emitted radiation, as is known in the display art (see A. P. Pritchard and S. P. Lake, Proc. SPIE 1994, p. 182–188). The decoders 38 and multiplexers 37 turn on a pixel pass transistor 31 thereby permitting an analog temperature equivalent voltage to be placed on the gate of a drive FET 33, which is in series electrical connection with the thermally isolated emitting pixel 12. FIG. 5 shows a schematic of the pixel electrical layout for a 256×256 element die mounted in an array package 50.

An important aspect of the array design is the substrate address electronics 50. The address electronics 50 at the pixel level perform two main functions. The address electronics 50 are used to select the proper pixel, given an image to project, using the address lines and then are used to maintain the analog temperature value written to the pixel between address frames to avoid flicker. Row and column address signals select a pass [resistor 31] *transistor 31* at the pixel level that transmits the analog temperature signal to the gate of a power FET 33, which control the current flowing through the pixel resistor 22. The size of the power FET 33 determines the amount of current through the pixel and, in combination with the pixel thermal conductance, defines the pixel temperature difference between the cryogenic substrate and the emitter pixel. The-emitter resistor 22 contacts the address electronics 50 through two vias to the level of the substrate 16, one that contact the Vdd line 34, and the other that contacts the drive FET 33. The resistor 22 and the FET 33 are designed to match the temperature and speed range of the pixel by providing sufficient power through proper choice of resistors and FET dimensions. In a typical application, because of the high pixel heating efficiency, a ten (10) micron by five (5) micron FET gate dimension is sufficient to achieve temperature rises of many hundreds of degrees. All the cell electronics 14 are easily contained within the pixel cell, which can be fabricated as small as two mils across.

The cell electronics 14 under each emitter pixel 12 includes a sample-and-hold circuit and a drive transistor. Monolithic digital decoders a buffer drivers are arranged around the periphery of the array to reduce input lines. For a 512 by 512 array of emitter pixels, the array is organized into column groups depending on the address speed. Typical address times are one (1) microsecond per pixel. For an array operating at thirty (30) hertz, eight (8) column groups provide the necessary speed. Accordingly, eight analog temperature signals are directed throughout the array using digital address lines. Nine digital lines select one of the 512 rows while six digital lines direct the eight parallel temperature signals to the appropriate column group. The entire array of 512 by 512 pixels is designed to be addressed at thirty (30) frames per second. Each pixel has 1 microsecond to read in the analog signal and store the value in the sample-and-hold circuit. The array die size varies but for a 3.5 mil pixel, the array size is 1.9 inches by 1.9 inches and fits on a four inch semiconductor wafer 16. Despite the large array size, the uniformity of electrical current is within plus or minus two and a half percent (2.5%), and fewer than 0.7% of the pixels were non-functional.

The gate voltage on the drive FET 33 determines the pixel current and temperature. This analog signal voltage containing the temperature information is maintained on the gate of the drive FET 33 with a pixel hold capacitor 35. We have found that at cryogenic temperatures, the hold capacitor 35 stores the charge sufficiently long to produce less than a one percent drop over a time period of many minutes and has less drop at higher frame rates. One source of unwanted pixel temperature change arises when current-induced voltage changes at the bottom plate of the hold capacitor 35 thereby changing the gate voltage from the value originally written to the pixel. This is most significant when the array is carrying large electrical currents, which occurs when large regions of the array are running at high temperatures. To minimize this effect, we have maximized the conductance of the ground return lines by having the Vss or ground return line in both first metal and second metal. Plus have the lines be criss-crossed in the horizontal and vertical directions. Vias connect both layers but are not shown. This design modification distributes the current paths in a two-dimensional sheet. This has been significant in reducing scene-dependent temperature variations and maintaining array temperature uniformity.

The other source of temperature change is Vdd drops in the array. To correct this problem we design the array to operate the driver FET 33 in saturation so that a Vdd change produces [no current] *no current change* and therefore, minimal temperature change.

To address discrete pixels 12 in the frame time required by the image to be conveyed through the array 10, a number of pixels 12 must be addressed in parallel. For example, in an operating 128×128 array, eight column analog signals are simultaneously routed to eight pixels whose location is determined by seven inputs to row decoder 38 and four inputs from the column group decoder 36. Low-flicker operation is obtained by ensuring that a capacitor 35 on the gate of the drive FET 33 has a long discharge time constant relative to the frame rate.

Based on tests carried out at cryogenic temperatures, address times for each channel of a 512×512 array have been on the order of about 300 nanoseconds. Thus, for a 512×512 array operating at a 200 Hz frame rate, 32 analog channels will provide the necessary access time. For slower video frame rate designs the number of analog channels and the corresponding external parallel drive lines can be reduced to eight.

For certain applications a microlens assembly 20 (FIG. 4) may be used to increase the performance of the array 10. In one embodiment, the microlens 20 is fabricated by etching a Si wafer in a plasma etch. The lenses are formed by the superposition of three separate mask levels, each containing twice as many steps as the preceding level thus forming a total of $2^n$ steps. Two mil-high stand-off posts 21 are preferably electroplated on the lens wafer to establish suitable emitter-lens spacing (≈2–5 microns) Thin film solder is sputter deposited on top of the posts in preparation for subsequent bonding to the emitter die. Physical assembly of the lens 20 to the array 10 is achieved by aligning the lens die and emitter die to within a 1 micron accuracy using an IR aligner which is a device providing alignment tolerance of about two (2) microns, not shown. The two die are brought into proximity and aligned in an IR aligner and a thin-film heater, not shown, raises the temperature of the top of the substrate to approximately 250 degrees Celsius to achieve appropriate solder flow conditions.

Typical pixel design variations: arrays can be fabricated with a wide range of pixel sizes and pitches to meet the requirements of a specific optical system. A 512×512 array containing pixels on a 3.5 mil pitch serves to display distant target patterns for a large collimating system at up to video frame rates. FIG. 7 is a scanning electron microscope (SEM) micrograph depicting an array at 2-mil pitch having a 15% fill factor at FIG. 7A and an array having a 50% fill factor at FIG. 7B. The 15% fill factor array of FIG. 7A is capable of 200 Hz frame rates, while the 50% fill factor array of FIG. 7B is capable of about sixty (60) Hz frame rates, each having the same thermal conductance. The length of the leg 18 is preferably 8 microns for the 50% fill factor array and 30 microns for the 15% fill factor array. In one embodiment, the pixels are arranged in a pseudohexagonal geometry for improved spatial resolution and have one shared electrical contact to the substrate, where it electrically couples to the drive bus, (FIG. 16c) which provides the electrical voltage (Vdd) on an electrically conducting line 34. The substrate 16 lies approximately 1–2 microns below the level of the emitter pixel 12 and contains a plurality of electrically conducting traces, Vdd 34, pixel address line 30, and signal voltage line 32. A portion of the pixel address line 30 forms a electrical bonding pad on the substrate 16 disposed on the transistor latch circuitry 31 (shown hatched in FIG. 1B). FIG. 16c illustrates a scaled drawing of a 2-mil pitch emitter that has 2 msec thermal time constant.

Each pixel 12 has a relatively flat upper surface, to within a few tenths of a micron, for maintenance of pixel optical properties and to ensure that the pixels are not in thermal contact with the substrate 16. During processing, it is preferred to maintain an even topography on the top surface of each pixel, which is maintained in the present process by carefully observing and controlling thin film stresses inherent in a thin film fabrication process.

Typical emitter fabrication process: The majority of the emitter structure 10 consists of silicon nitride ($Si_3N_4$) film 62. These films also form the bulk of the material comprising the leg 18, which helps provide for minimal thermal contact between the substrate 16 and the emitter 12. In one embodiment, the serpentine resistor 22 is embedded in the film 62. For cryogenic operation, such resistor material should have a low TCR, be resistant to sacrificial etch materials using in processing the array 10, and have a sheet resistance on the order of a few hundred ohms/square. Sputtered TiNx is one film that meets this criteria. The film compositions can be varied over narrow limits by changing the nitrogen content during deposition and an annealing process for the post deposition, described below.

Figure 6:
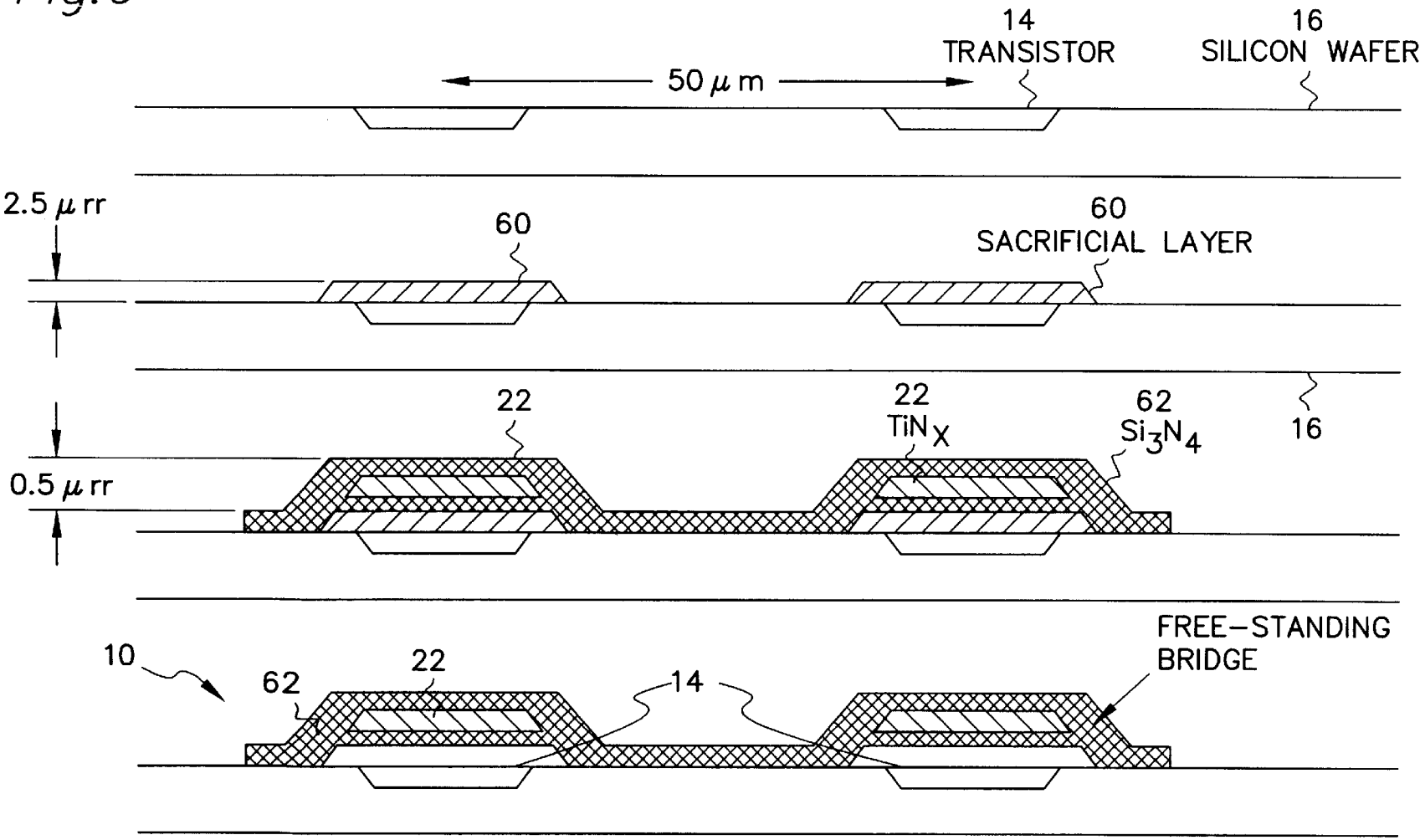
FIG. 6 is a flow diagram depicting the basic sequence for fabricating the emitter pixel used in the arrays of the present invention.
Figure 10A:
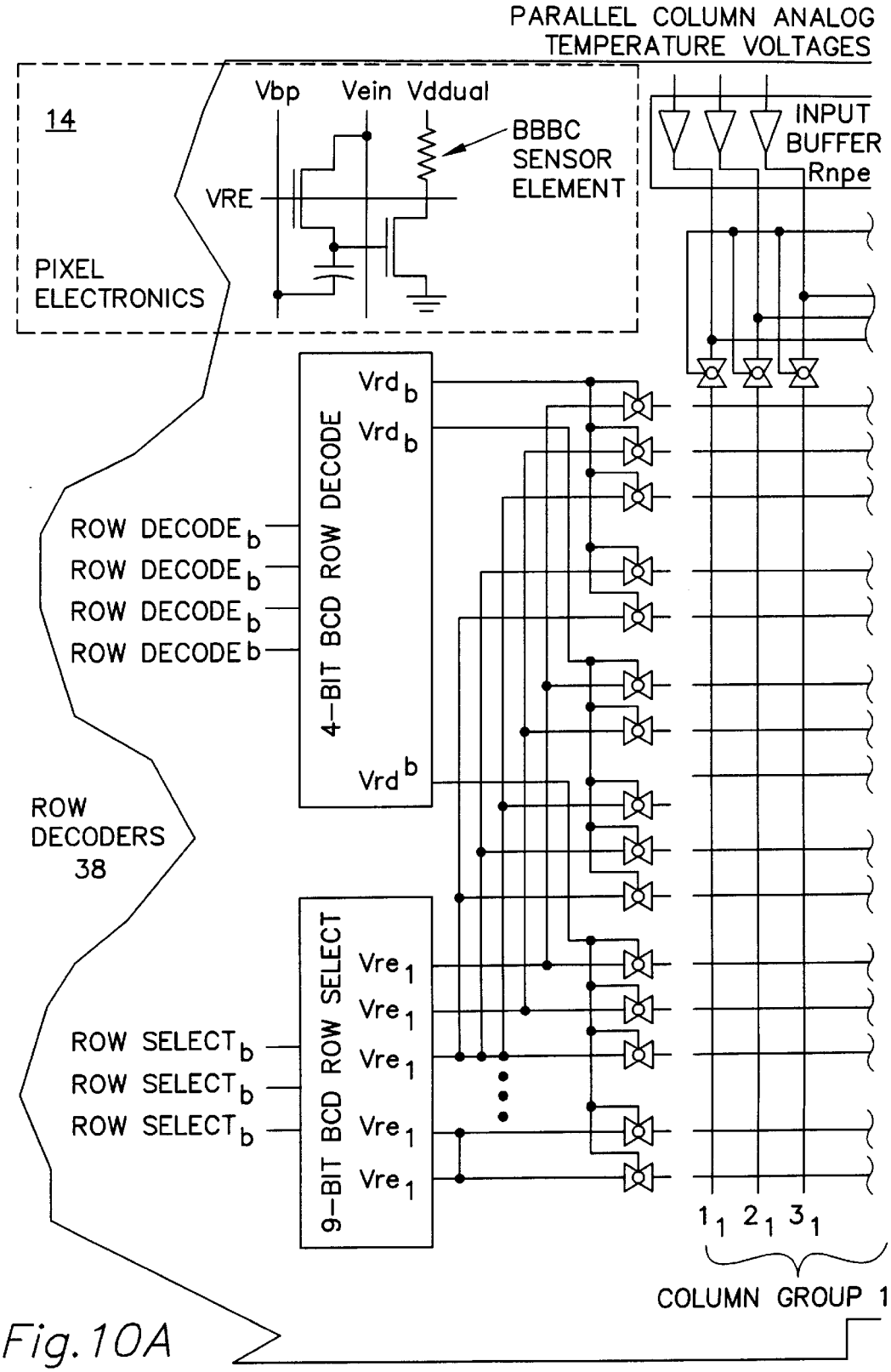
FIG. 10A–C depicts the addressing electronics of the present invention in a schematic depiction.
Figure 10B:
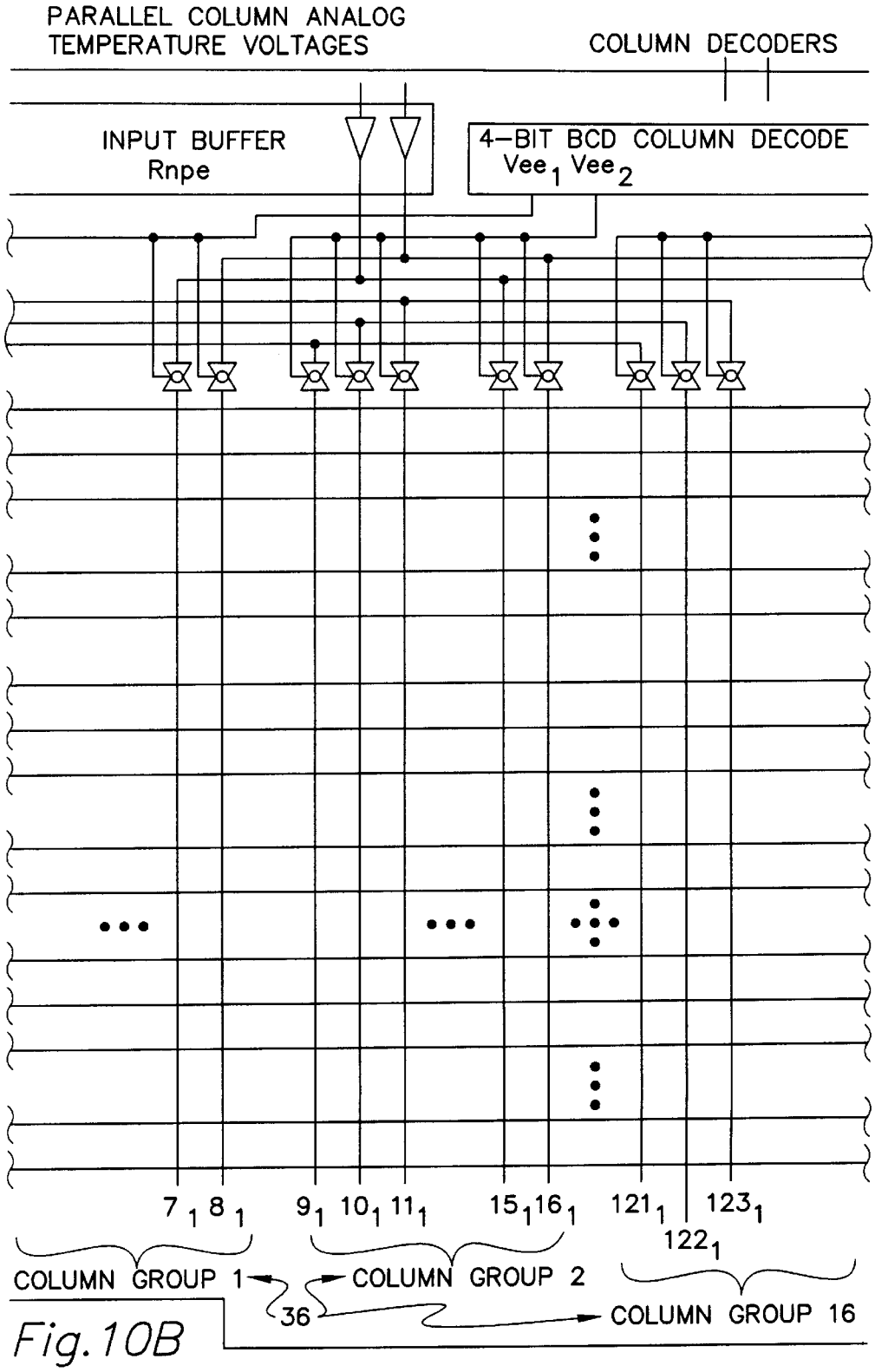
Figure 10C:
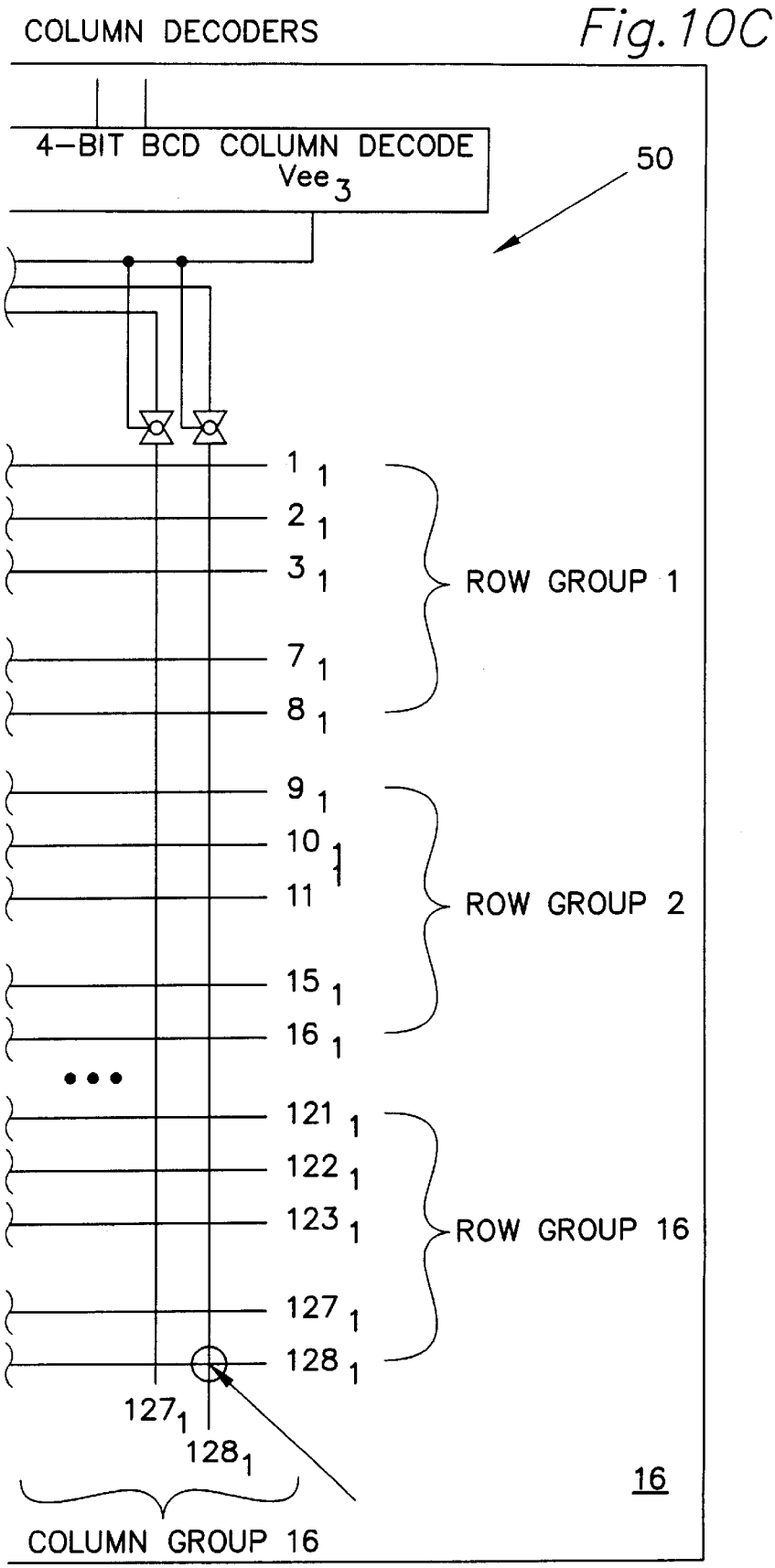
Figure 13:
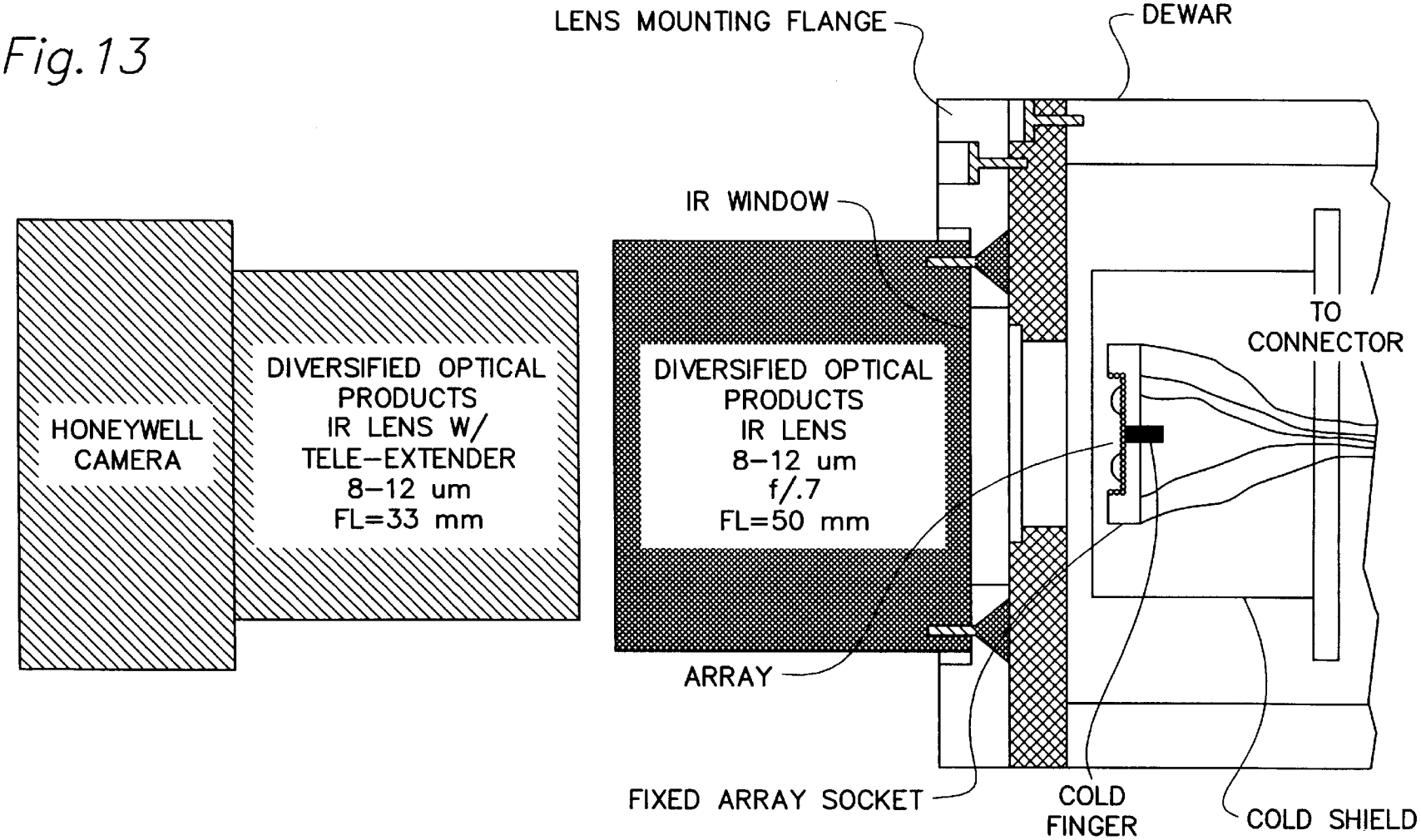
FIG. 13 is an elevational side view in cross section of an emitter test station usable for testing the arrays of the present invention.
Figure 14:
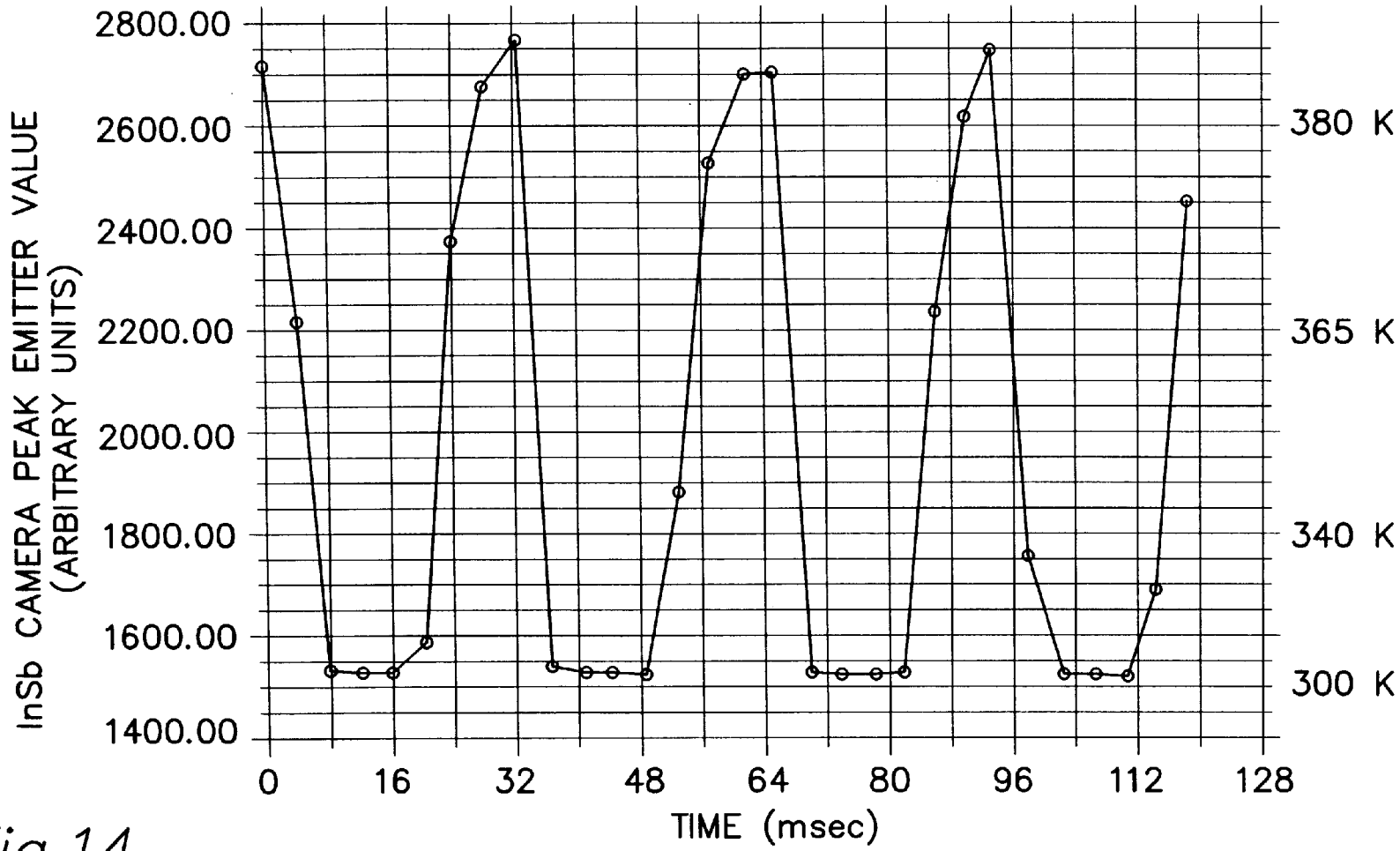
FIG. 14 is a graphical depiction of timed measurements of peak emitter values versus time (in milliseconds) of an array made according to the present invention.

With respect to the emitter pixel, the basic fabrication process is shown in FIG. 6 consisting of repetitively depositing and patterning a sacrificial layer 60 on a substrate 16 containing drive electronics 14 at the periphery of the substrate. Then, alternating layers of the silicon nitride film 62 and a single resistor film 22 are deposited and patterned over the sacrificial layer 60. a preferred material for the resistor 22 is TiNx, which makes contact with the substrate traces, which are typically made of a metal. In the final process step removal of the sacrificial layer 60 with a suitable etchant forms the free standing microbridge-type suspended emitter pixel 12.

Typical die processing process: Prior to fabricating the full array structures on a semiconductor wafer, a temporary thin passivation layer of polyimide is put down over the substrate and a "dummy" resistor is laid down and electrically coupled to the substrate electronics to test. Presently, no repair of potentially defective substrate electronics is encouraged, as the test simply indicates whether the substrate works so that further processing effort is not wasted on a non-operating substrate. After the testing process, the Polyimide is removed, and if the test indicated the substrate was operating it is further processed in accordance with the present invention. Polyimide was chosen for the testing process because of its electrical isolation and low thermal conductance properties, its ease of application and complete removal with known etchants, as well as the relative ease of fabricating metalized vias in the polyimide layer to convey electrical current from the dummy resistor to the substrate. The die are electrical probed at the wafer level before beginning the dicing process, so that any defects may be eliminated from further processing. Then each discrete array is cut from the wafer. The severed arrays 10 are then preferably mounted in evacuated packages or in a cryogenic dewar. The electrical probing of the die at wafer level is accomplished by addressing each pixel at a time and measuring the current draw by the array 10 as the pixel being tested is cycled on and off. As shown in [FIG. 7]*FIG. 8*, a map of the electrical current may be generated for each die of a test array. As a result of the fact that the measurement is typically taken with the FET operating in the saturation regions, the map is principally a measure of "dead" pixels and FET current uniformity. Dead pixel count is a major contributor in the performance of the finished array. Often, dead pixels are produced by electrical shorts between the substrate metallization lines 30, 32 34 which provide the electrical current to the pixels. These short circuits can effectively make every column pixel defective. A second cause of dead pixels is the inability of the electrical current to reach the emitter resistor 22. The usual cause of this type of defect is an open resistor which was inadvertently attacked and severed during the etch phase or the cause may be poor electrical contact between the resistor 22 and the substrate electronics 14.

Electrical measurements for array uniformity and defects: Observed defects of the variety just noted, have been limited to as few as five die out of 100 with row and column outages. A good measure of array quality is the count of those pixels which have a current outside the average electrical current by more than twenty percent. Some of the die had only one dead pixel out of 16,000 pixels. The standard deviation in the pixel electrical current for most of the die has been in the range of three to five percent.

In an observed 512×512 array, the average electrical current flow was measured at 147 microamperes with a three percent standard deviation. Of the 252,144 pixels of such an array, 1,919 (or only 0.7%) were outside the standard deviation range, and 895 of those (0.3%) of the total, are dead. The remaining dead pixels were contained in one column and two rows. Note that this level of pixel outage is more than sufficient to produce high quality imagery.

Optical design advantages are obtained by use of high resistance material for the serpentine resistor 22 that is also optically uniform; as mentioned, use of silicon nitride allows very high fill factors due to its thermal isolation characteristics and because it is amenable to known semiconductor processing techniques; and use of a tunable gap structure allows each pixel to project radiation which is a function of [gap distance times the wavelength of 0 emitted radiation] *gap distance.*

Typically an Infrared scene projector can be used to test infrared sensing hardware systems and simulate dynamic responses to desired preselected artificial scenes. In many cases these tests can replace actual field test of the infrared sensing hardware and thereby save considerable testing cost. Several approaches to infrared scene projector arrays are available in the literature. The inventors have investigated many types of IR scene projector technologies, and feel that the resistively-heated infrared scene projector technology offers the most versatility and is the highest performance of the known approaches, but that the two-level silicon-nitride pixel 12 microbridge structure has the best combination of high radiance output and low power consumption. The latter types allows very large size arrays of 512×512 dimension to be built using this technique.

To reprise, the microbridge structure is preferably a silicon-nitride microbridge fabricated monolithically on top of addressing electronics using standard IC processes. The readout electronics may be one of several devices, e.g., CMOS, TFT, BiCMOS, bipolar, GaAs devices, SOl device, etc. The particular device used in one embodiment uses CMOS devices wherein the microbridge pixel 12 is suspended above the readout electronics in each pixel so that the emitting surface does not compete with the readout electronics for space. Thus, very high fill factor designs are achievable and for a 3.5-mil pitch design a 89% fill factor may be attained using this structure. The siliconnitride material comprising the microbridge pixel 12 also allows very low thermal conductance between the microbridge and the silicon substrate. This thermal isolation property is especially critical in large area arrays where over 250,000 pixels may be turned on at once. A typical embodiment may have a power requirement of 0.1 pW/K per pixel and cross coupling between neighboring pixels is almost nonexistent. When operated in vacuum, the only shared contacts between neighboring pixels are at the electrical contacts to the silicon substrate and since the silicon substrate acts as a heat sink, the amount of cross coupling is practically nil. Radiative coupling is very small too because only a thin cross section of the microbridge is exposed to neighboring pixels.

Sacrificial layer

Thermal isolation of the microbridge pixel structure 12 is assisted by operating the device in vacuum, since without the vacuum, air conductance (through the brownian motion) of the gas molecules) can increase thermal leakage of the microbridge by approximately two orders of magnitude. As can be seen in FIG. 6, when the structure is fabricated, the structure is preferably built on top of a sacrificial layer. At the end of the process, the sacrificial layer is removed to thermally isolate the structure from the silicon substrate 16. Although one skilled in the art will recognize that several different films may be used as sacrificial layers for the structure herein.

Silicon dioxide is a commonly known and used dielectric layer that may be used as a sacrificial layer with the present invention. This material may be removed by known wet etch techniques using HF-based chemistry. Other etch accelerator layers between the microbridge and sacrificial layers may be added to facilitate the lateral etch rate of the sacrificial layer. Polyimide may also be used as a sacrificial layer for the structure herein as this material may be etched using an oxygen plasma to undercut the structure. The result of such a dry etch process is that it is much more selective and less damaging to the structure being fabricated.

Thermal isolation legs

For large area arrays, several enhancements may be made to the thermal isolation features of the structure so far described. First, the leg structure may be made thin to reduce thermal conductance. The limitation to the thickness of the leg 18 depends on the mechanical strength of the material used. Should the structure warp or bend as a result of too thin a structure to leg 18, the cavity 23 will lose some of its critical performance and, in the extreme case, the body or pixel 12 of the microbridge may touch the silicon substrate 16 and result in a loss of thermal isolation. In our fabrication runs leg 18 had a thickness that ranged down to 5000Å. Leg 18 thickness of 4000Å should be attainable without undue experimentation by those skilled in the art.

The thermal resistance of the legs needs to be large compared with the resistance of the microbridge pixel 12. This prevents large thermal gradient in the microbridge pixel 12 during operation. A large gradient would result in a smaller effective radiating area for the pixel 12 and a non-uniform emission temperature. During the design of the structure, the length of leg 18 must be traded off with the response speed of the emitter 12 and its fill factor.

In one embodiment the microbridge structure uses a reflector 70 and an absorber layer 72 in the interior of gap 23 to attain a high emissivity for the microbridge structure. The stack consisting of the microbridge layers, the vacuum gap 23, and the reflector 70 forms a low Q resonant cavity for radiation in the [2–20 pm wavelength band] *2–20 μm wavelength band*. The resistor pattern 22 in the emitter does not alter the overall optical response of the emitter cavity 23 because of the high resistivity of the resistor 22. This gives high emissivity in all of the areas covered by the silicon-nitride microbridge whether there is a resistor pattern in the microbridge.

[VVhen] *When* the microbridge is fabricated, the silicon nitride films are under compressive stress when attached to the sacrificial layer. Once the structure is released through the sacrificial layer etch, the film stress relaxes and the bridge tends to twist around the contact region. The design of the microbridge attaches the main body of the microbridge at the corners so that the body may twist slightly with the legs taking up the tension from the twisting motion. Thus, the body may remain a flat pixel structure with relatively low stress, and we found that a flat pixel structure is important in order to maintain the thermal isolation necessary for this structure to work efficiently as an emitter.

High emissivity over a broad band is accomplished through an absorber layer 72 beneath the silicon nitride microbridge pixel 12. A thin layer of material with approximately ≈400 Ohm/square has the optimal absorption in the stack and acts to detune the resonance set up by the reflector and the vacuum gap. In the present invention, a thin layer of NiCr is used for this absorber layer 72 because of its resilience to etchants during processing sacrificial layer etch and because of its controllability during sputter deposition.

Physically supporting, thermally isolating, and electrically conducting contacts:

The low thermal conductance and the high emissivity would not be possible without a strong contact region that supports the entire structure. The same structure must also provide good electrical and thermal contact to the substrate 16. For a quarter wavelength structure designed to optimize emissivity, this contact needs to be up to 1.8 μm deep and less than 10 μm on a side to minimize its footprint. Making a good electrical contact through such a via is vital to the overall yield of the array. The metallization that runs through the microbridge pixel 12 must also make contact to the metallization from the addressing electronics 50. The contact must be etch-tolerant of the etchants used during the sacrificial layer etch. Two approaches can be used to fabricate this contact. The first is a "basket" contact, shown in FIG. 11, and is primarily used for wet etched sacrificial layer processes and the second is a "plug" contact, shown in FIG. 12, that is primarily used for dry etched sacrificial layer processes; both are described in greater detail below.

During a wet etch process to remove the sacrificial layer, the etchant can also attack the planarization oxide underneath the contact areas. The goal of the basket contact is to build a mechanically strong support for the microbridge pixel 12 that isolates as well as supports; and, at the same time, provides a high yielding electrical contact. In order to improve the step coverage of the metal on leg 18 that makes electrical contact from the microbridge pixel 12 down to the metallization in the addressing electronics 50, the contact is terraced into two steps. The first step drops from the microbridge level down to the bottom of the vacuum gap 23. This step is typically 1–1.8 μm tall. The sidewalls are tapered to facilitate step coverage. The second step feeds through the planarization oxide down to the addressing electronics.

The metal for leg 18 is patterned over these steps to make contact to the metal on [substrate 15] *substrate 16*. The design of thermal isolation structure requires the metal on leg 18 be as thin as possible to minimize thermal conductance. The mechanical strength of the basket contact 60 comes from the silicon nitride layers that are also used in the microbridge body. The leg metal is sandwiched between these nitride layers to shield it against possible attack by the etchant used during the sacrificial layer etch.

A plug metal 64 using either copper-based metal or aluminum-based metal may be applied in the basket contact to better secure the electrical contact between the leg metal and the substrate metal. This plug metal 64 also seals the bottom of the basket against the wet etchant during the sacrificial layer etch. Without this plug metal, the etchant in the wet HF etch process can penetrate cracks within the thin film structures to attack the planarization oxide and remove the base on which the basket contact stands. The addition of the plug metal 64 reduces the ability of the etchant to penetrate into the planarization oxide. The plug metal also adds to the mechanical strength of the contact to stabilize the microbridge pixel 12 from bending after the sacrificial layer etch.

When a dry-etched sacrificial layer is used, such as polyimide, the planarization oxide is much more immune to the dry etch process. The contact area may be simplified significantly to give the same high electrical yield and mechanical strength. The plug contact may reduce two mask layers in the process compared with the process for fabricating the basket contact. The plug metal 64 may be deposited and patterned first by a liftoff process. The top of the plug metal needs to be even with the top of the bottom pixel nitride so that the leg metal may be patterned directly over the plug metal. The top bridge nitride is then deposited and patterned over the leg metal. Because of the high selectivity between polyimide and the metallization used in this process, there is excellent electrical yield through this process. The silicon nitride materials provide excellent mechanical stability to give the arrays good mechanical yield.

TiWN

A number of resistor materials can be used with the present invention, but they preferably must have sheet resistances in the 100 Ohm to the 1 KOhm range for good optical properties, and low currents. Resistive films must also be stable at high temperatures, and be capable of being reproducibly deposited. An added advantage is if the various film resistances can be varied during the deposition process by controlling the gas environment. A number of transition metal nitrides meet this requirement but perhaps the best are TiWN and TiN.

Sputter deposited TiWN is used as the material for resistor 22 in the scene projector array 10. This material provides the high resistivity film required in order to maintain low operating current for each pixel; at the same time it has very low TCR so that the pixels may operate over a wide range of temperatures. The scene projector emitters described herein operate at between 20K and 1000K. Deposition of the TiWN material is easy to control as the resistivity of the material may be determined by the flow rate of nitrogen during the sputtering process. The resistance may be controlled over three orders of magnitude in range and reproducibly from run to run. Large tolerance to high operating current.

When operating a large area emitter array such as a 512×512 scene projector, the amount of current required to power the entire array may lead to large voltage drop across the buslines. We have found that the most significant voltage change will occur in the ground line and since the analog voltage is referenced to the external ground line, any change in the internal ground line will result in the same amount of change at the gate voltage. Therefore, depending on the operating condition, the amount of voltage rise in the ground line may lead to a radiance loss up to 50%.

In the present invention, and in order to minimize the ground line voltage drop, the grounding grid for the arrays is wired in both horizontal and vertical directions. This reduces the effective resistance of the bus line significantly. The roll-off in the voltage drop also occurs gradually in a radial direction rather than sharply across a row or a column—if the buslines were routed in one direction only as is known and practiced in the prior art. The horizontal ground lines connect to the vertical ground lines at each pixel to provide multiple conduction paths for the electrical current.

Another effective resistance reduction technique employed in the present invention is to make an attachment to ground or reference potential through the substrate at each pixel. At room temperature, this proves to be an effective way of reducing the ground voltage rise at each pixel. A typical substrate resistance at each pixel is approximately 100 Ohm for a 2-mil pitch pixel. The backside of the wafer serves as a large ground contact to aid the process.

Changes in the VDD busline may also affect the operating current in each pixel. Because the FET currents saturate after pinch off, the pixel current is relatively unaffected by changes in VDD. The designs of the FET size and emitter current need to carefully consider the bias point of the driver FET such that the load line crosses the FET I-V curves in the saturated region. This avoids VDD variation in the buslines from affecting the output radiance of the emitter.

While the present invention has been described with reference to preferred embodiments, a person skilled in the art will recognize variations that fall within the spirit and scope of the present invention as defined by the following claims.

We claim:

[1. An apparatus for emitting a wide-band infrared image, comprising:

a semiconductor substrate having a plurality of cavities therein;

address means disposed on the substrate proximate the plurality of cavities for routing electrical signals to various portions of the substrate, wherein the electrical signals include a pixel addressing signal, a voltage signal, and drive voltage;

at least two emitter pixel members coupled to the address means and each disposed above one of the plurality of cavities in the substrate wherein each emitter pixel member comprises a two-level microstructure: a first level bearing a transistor means, and a second level, set apart and disposed above the first level, and comprising the emitter pixel member, wherein the first level is made of silicon nitride and wherein the second level has an absorber and the first level has a reflector layer opposite of and facing the absorber layer;

means for connecting, supporting, and thermally isolating each pixel member from the substrate;

a trace of electrically resistive material coupled to each pixel member and at least one leg physically and electrically coupled to the substrate;

electronic control means for electrically coupling the pixel addressing signal, the voltage signal, and the drive voltage to each emitter pixel member; and, transistor means for driving a controlled amount of electrical current through the trace of electrically resistive material and for maintaining the temperature of the trace.]

[2. The apparatus of claim 1, wherein the electrically resistive material is embedded into the second level and wherein the resistive material comprises titanium nitride.]

[3. The apparatus of claim 2, wherein electronic control means comprises a pixel decoder/multiplexer select circuit and a row enable decoder each electrically coupled to a plurality of discrete pixel column group electrical interconnections.]

[4. The apparatus of claim 3, further comprising a plurality of emitter pixel members disposed in an array configuration and having a fill factor greater than eighty percent.]

[5. The apparatus of claim 4, further comprising a microlens assembly coupled to the substrate with a plurality of stand off posts, so that a single microlens optically couples to each emitter pixel member.]

[6. The apparatus of claim 5, wherein the plurality of stand-off posts comprise silicon nitride with a layer of thin film solder proximate the microlens assembly which is previously electroplated to the substrate.]

[7. The apparatus of claim 4 wherein the plurality of emitter pixels comprise an array on a 3.5 mil pitch.]

[8. The apparatus of claim 7 wherein the array comprises at least a 512 by 512 array of 262,144 emitter pixels.]

[9. The apparatus of claim 1, further comprising:

a layer of planarization oxide disposed covering said transistor means, a passivating layer disposed covering said planarization oxide layer; and, a reflector layer is disposed covering said passivating layer, so that said reflector layer opposes said second level.]

[10. The apparatus of claim 9, further comprising:

an absorber layer disposed on a nitride layer formed on the second level, directly opposing the reflector layer across a gap region.]

[11. The apparatus of claim 10, wherein said gap region is evacuated to a pressure less than ambient pressure.]

[12. The apparatus of claim 11, wherein said reflector layer and said absorber layer contain the same surface area.]

[13. The apparatus of claim 12, further comprising a metallic plug member disposed to electrically couple only to the electrically resistive material and the electronic control means without establishing electrical contact with said reflector layer or said absorber layer.]

*14. Apparatus for emitting a wide-band infrared image comprising:*

*a) a substrate, said substrate having a reflective surface;*

*b) an emitter pixel member supported above and by said substrate, said emitter pixel member being (i) comprised of material which, when heated, emits infrared radiation and (ii) spaced above said reflective surface of said substrate so as to define a cavity therebetween; and*

*c) electrical connection means connected to said emitter pixel member and adapted to selectively apply electric current thereto so as to heat said member;*

*d) said apparatus being further characterized by the distance between said reflective surface and said emitter pixel member being selected to provide a tuned optical cavity to thus provide a high optical emissivity of said emitter pixel member over a preselected band of infrared wavelengths.*

*15. The apparatus of claim 14 wherein said emitter pixel member also has absorber characteristics.*

*16. The apparatus of claim 14 wherein said emitter pixel member includes an absorber layer.*

*17. The apparatus of claim 14 wherein said substrate is of semiconductor material.*

*18. The apparatus of claim 17 further characterized by having integrated circuit means disposed on said semiconductor substrate.*

*19. The apparatus of claim 18 further characterized by said reflective surface being an infrared reflector layer.*

*20. The apparatus of claim 18 further characterized by said electrical connection means including said integrated circuit means.*

*21. The apparatus of claim 16 further characterized by said material being titanium nitride.*

*22. The apparatus of claim 14 further comprising a plurality of emitter pixel members disposed in an array configuration.*

*23. The apparatus of claim 22 wherein each of said emitter pixel members includes absorber means.*

*24. The apparatus of claim 23 wherein said substrate is of semiconductor material.*

*25. The apparatus of claim 24 wherein integrated circuit means are disposed on said semiconductor substrate.*

*26. The apparatus of claim 25 wherein said reflective surface of said substrate is an infrared reflector layer.*

*27. The apparatus of claim 26 wherein said electrical connection means includes said integrated circuit means.*

*28. The apparatus of claim 23 wherein said material is titanium nitride.*

*29. The apparatus of claim 14 wherein said support of said emitter pixel member by said substrate includes means for thermally isolating said member from said substrate.*

*30. The apparatus of claim 22 wherein said support of each of said pixel members by said substrate includes means for thermally isolating said members from said substrate.*

*31. The apparatus of claim 14 further comprising a trace of electrically resistive material disposed on said emitter pixel member and on a leg physically and electrically coupled to said substrate, said leg facilitating the thermal isolation of said member from said substrate.*

*32. The apparatus of claim 27 wherein said integrated circuit means includes address means for routing electrical signals to various portions of said substrate, said signals including a pixel addressing signal, a voltage signal, and drive voltage; and said apparatus further comprises electronic control means for electrically coupling said signals to said emitter pixel members.*

*33. The apparatus of claim 32 further comprising:*

*a) a trace of electrically resistive material disposed on said emitter pixel members and on legs respectively physically and electrically coupling said members to said substrate, said legs facilitating the thermal isolation of said members from said substrate, and*

*b) means for driving a controlled amount of electrical current through said trace of resistive material.*

*34. The apparatus of claim 33 wherein said electronic control means comprises a pixel decoder/multiplexer select circuit and a row enable decoder each electrically coupled to a plurality of discrete pixel column group electrical interconnections.*

*35. An apparatus for emitting a wide-band infrared image comprising:*

*a) a semiconductor substrate;*

*b) integrated circuit means disposed on the substrate;*

*c) an array of emitter pixel members supported above and by said substrate and electrically coupled to said integrated circuit means, each of said emitter pixel members being (i) comprised of material which, when heated, emits infrared radiation and (ii) spaced above said substrate so as to define a cavity therebetween; and apply electric current thereto so as to heat said member;*

*d) an infrared reflector layer disposed on said substrate opposite said emitter pixel members;*

*said apparatus being further characterized by the distance between said reflector layer and said emitter pixel members being selected to provide a tuned optical cavity to thus provide a high optical emissivity of said emitter pixel members over a preselected band of infrared wavelengths.*

*36. The apparatus of claim 35 wherein said emitter pixel members also have absorber characteristics.*

*37. The apparatus of claim 35 wherein each of said emitter pixel members includes an absorber layer.*

* * * * *